United States Patent [19]

Enami et al.

[11] Patent Number: 5,401,356

[45] Date of Patent: Mar. 28, 1995

[54] METHOD AND EQUIPMENT FOR PLASMA PROCESSING

[75] Inventors: Hiromichi Enami, Tachikawa; Kiyomi Yagi, Hamura; Masanori Katsuyama; Akihiko Konno, both of Ohme, all of Japan

[73] Assignee: Hitachi, Ltd., Tokyo, Japan

[21] Appl. No.: 922,487

[22] Filed: Jul. 31, 1992

[30] Foreign Application Priority Data

Aug. 12, 1991 [JP] Japan .................... 3-201717

[51] Int. Cl.$^6$ .......................... H01L 21/306
[52] U.S. Cl. .................. 156/643; 427/574; 427/569; 117/103
[58] Field of Search ............ 156/643; 427/574, 569; 437/81, 225, 233, 235, 228; 117/103

[56] References Cited

U.S. PATENT DOCUMENTS

| | | | |
|---|---|---|---|
| 4,401,054 | 8/1983 | Matsuo et al. | 118/723 |
| 4,421,592 | 12/1983 | Shuskus et al. | 427/39 |
| 4,962,727 | 10/1990 | Harada | 118/723 |
| 5,017,835 | 5/1991 | Oeschsner | 315/111.81 |
| 5,221,425 | 6/1993 | Blanchard et al. | 156/643 |
| 5,259,881 | 11/1993 | Edwards et al. | 118/719 |
| 5,273,586 | 12/1993 | Kim et al. | 118/723 E |

FOREIGN PATENT DOCUMENTS 62-20321  1/1987  Japan .
63-4054   1/1988  Japan .................. 118/723 E
2-258048  10/1990 Japan .

OTHER PUBLICATIONS

SPIE Proceedings, Oct., 1989, vol. 1185, "Dry Processing for submicrometer Lithography", Bondur et al, pp. 86–97.

*Primary Examiner*—R. Bruce Breneman
*Assistant Examiner*—Linda J. Fleck
*Attorney, Agent, or Firm*—Fay, Sharpe, Beall, Fagan, Minnich & McKee

[57] ABSTRACT

The amount of dust particles deposited on a semiconductor wafer during plasma etching or CVD in manufacturing a semiconductor integrated circuit is decreased by second plasma generating electrode 28 disposed around a lower electrode 15 in a plasma etching chamber 4a. High frequency voltage is applied to the second plasma generating electrode 18 just before the stop of plasma discharge to form a sub-plasma of high density along the outer periphery of the lower electrode 15, there is formed a sub-potential distribution acting to push out negatively charged dust particles stagnating near the main surface of a semiconductor substrate 7 toward the outer periphery of the wafer. The negatively charged dust particles thus pushed out from the vicinity of the main surface of the wafer 7 are moved to the second plasma generating electrode 28 and exhausted by a vacuum pump through an exhaust port 25.

32 Claims, 15 Drawing Sheets

METHOD AND EQUIPMENT FOR PLASMA PROCESSING

BACKGROUND OF THE INVENTION

The present invention relates to plasma processing, particularly to plasma processing in the production of a semiconductor integrated circuit device.

In the manufacturing process for semiconductor integrated circuit devices there are various plasma chemical reactions. For example, plasma etching and plasma CVD (Chemical Vapor Deposition) have already been established as manufacturing techniques for semiconductor integrated circuit devices.

According to the plasma processing, reaction gas is discharged under reduced pressure to generate such reaction seed as electrons, ions and radicals, which are not stable under atmospheric pressure, thereby accelerating a predetermined chemical reaction to effect the aforesaid etching or CVD. The plasma processing can be a low-temperature process, a dry process, etc. and this is very desirable in the manufacture of semiconductor integrated circuit devices.

In the case of plasma processing, however, since the processing is carried out by utilizing a chemical reaction, dust particles, for example reaction product, are produced during the processing, and such dust particles are deposited on a semiconductor wafer and the inner wall of a processing chamber in the plasma processing equipment. It is known that this causes various problems.

For example, in the case of patterning a laminate film by plasma etching, separate processing chambers are sometimes used for upper and lower layers of the laminate film, that is, patterning is performed twice, separately, in view of the difference of etching gases, etc. In this case, dust particles deposited on a semiconductor wafer during the plasma etching of the upper layer undesirably act as an etching mask (hereinafter referred to simply as "mask") in the plasma etching of the lower layer, thus causing various problems, for example change in shape and size of pattern and short-circuit of the conductor patterns in the longitudinal and transverse directions.

For example, in Japanese Patent Laid Open Nos. 20321/87 and 258048/90 there are described techniques for removing dust particles in plasma processing.

According to the technique described in the Japanese Patent Laid Open No. 20321/87, a reaction product collector capable of moving into a load-lock chamber is disposed around a semiconductor wafer table in a plasma reaction chamber, to remove dust particles produced during plasma processing.

According to the technique described in the Japanese Patent Laid Open No. 258048/90, an electrostatic attractor for the attraction of dust particles is disposed around a semiconductor wafer in a plasma processing chamber to remove dust particles produced during plasma processing.

SUMMARY OF THE INVENTION

Dust particles produced during plasma processing or those separated from the inner wall of a processing chamber are usually charged negatively, so they are influenced by an electric field formed in the processing chamber upon generation of plasma.

In plasma processing, no matter whether the processing may be etching or CVD or the like, a high density plasma is formed just above a substrate, for example a semiconductor wafer as a workpiece, so that a negative electric field is formed along the outer peripheral portion in the processing chamber, which perpherial portion of the electric field is stronger than the central portion in the chamber. Consequently, the negatively charged dust particles are pushed toward the center of the processing chamber, that is, just above the semiconductor wafer, by the stronger negative electric field formed along the outer peripheral portion in the processing chamber, and the dust particles stagnate in a sandwiched state in between plasma (a cloud above the dust as viewed in FIG. 1) and an ion sheath (a layer between the wafer and the dust).

The number of such negatively charged dust particles increases in the plasma-ion sheath interface during plasma processing, and this phenomenon is described, for example, in SPIE, Dry Processing for Submicrometer Lithography, "Insitu Particulate Contamination Studies in Process Plasmas," (October 1989), pp. 86–97.

As soon as the plasma discharge is stopped, the negatively charged dust particles stagnating just above the semiconductor wafer in plasma processing are released from the restraint of the electric field formed by the plasma, resulting in the dust particles falling onto the wafer and depositing thereon. The dust particles do not become a pattern defect in that plasma processing but cause a pattern defect in the process which follows the just performed plasma processing process, thus resulting in deterioration of the yield and reliability of the semiconductor integrated circuit device obtained.

According to a study made as a part of the present invention, it turned out that, of dust particles which have been stagnating above the wafer and which will deposit on the wafer, 10% deposit on a semiconductor wafer during the plasma process and the remaining 90% fall and deposit just after the stop of plasma discharge.

The conventional techniques described in the foregoing publications are each effective in the removal of dust particles present only around the outside of the wafer table and require additional structure be provided around the wafer table in the plasma etching chamber. In those conventional techniques, however, due consideration is not given to removing the negatively charged dust particles stagnating just above the semiconductor wafer, so a satisfactory effect is not attained for preventing the phenomenon of deposition of dust particles on the wafer upon stopping the plasma discharge. Thus a satisfactory effect has heretofore not been obtained in the removal of dust particles.

There also has been proposed a plasma processing equipment of a structure wherein a semiconductor wafer is placed in a sideways or downwards facing posture to suppress the deposition of dust particles thereon. However, this structure is complicated and is not fully effective in removing dust particles. This is because the dust particles per se are light in weight so the probability of moving under the influence of gravity is small.

At present, therefore, in the case where plasma etching is to be performed in two stages, like the foregoing plasma etching of a laminate film, the upper layer is subjected to patterning by a first plasma etching process, then a semiconductor wafer is taken out from the processing chamber and subjected to wet cleaning for preventing a defect caused by dust particles before conducting the second stage of plasma etching. At the time of cleaning, the pattern of photoresist (simple "resist" hereinafter) which has been used as a mask for patterning the upper layer is also removed. This is because otherwise the wafer material which was absorbed by the resist during the wet cleaning will leave the resist in a second stage of plasma etching and exert a bad influence on subsequent plasma processing characteristics, for example, deteriorate the uniformity of etching or generate etch residue. In this case, therefore, after the cleaning and removal of resist, a series of exposure processings, including the application of resist, exposure, development and drying, are applied to the semiconductor wafer after the wet cleaning to form a resist pattern to be used as a mask at the time of patterning the lower layer, the second stage.

Such above described conventional techniques wherein a wet cleaning process is carried out between stages of plasma processing have involved the following problems, although a satisfactory effect can be obtained in the removal of dust particles.

(1) The plasma processing equipment becomes larger in size because it is necessary to provide a wet cleaning mechanism.

(2) Various processings are required such as, for example, wet cleaning, resist removing, and exposure for the formation of a resist pattern serving as a mask in the second stage of plasma etching, so the number of manufacturing processes and the manufacturing time for a semiconductor integrated circuit device increase and the processing efficiency becomes lower.

(3) Since the semiconductor wafer used in forming an LSI is taken out of the processing chamber after plasma processing, the elements or devices on the wafer are thereby exposed to oxygen and changed in a size of a critical dimension due to oxidation, for example, resulting in deterioration of the yield and reliability of the semiconductor integrated circuit device obtained.

(4) Due to moisture or the like deposited on the surface of the wafer taken out of the processing chamber, the plasma becomes unstable in the succeeding second stage of plasma processing, thus causing deterioration in the yield and reliability of the semiconductor integrated circuit device obtained.

The present invention has identified and analyzed the above-mentioned problems and it is an object of the invention to reduce the amount of dust particles deposited on a workpiece substrate during plasma processing.

It is another object of the present invention to reduce the size of a continuous plasma processing equipment.

It is a further object of the present invention to decrease the number of processes in continuous plasma processing and shortening the processing time.

It is a still further object of the present invention to improve the processing efficiency in continuous plasma processing.

It is a still further object of the present invention to ensure the stability of plasma processing in continuous operation.

The above and other objects and novel features of the present invention will become apparent from the following description and the accompanying drawings.

Typical inventions out of those disclosed herein will be outlined below:

(A) A plasma processing performed with plasma formed in a processing chamber containing a workpiece substrate, includes switching over a potential distribution in the processing chamber to a sub-potential distribution for pushing out dust particles stagnating near a main surface of the substrate toward the outer periphery of the substrate.

(B) A first plasma processing of workpiece substrate with a first plasma formed in a first vacuum processing chamber containing the substrate includes switching over a potential distribution in the first processing chamber to a sub-potential distribution for pushing out dust particles stagnating near a main surface of the substrate toward the outer periphery of the substrate; transferring the substrate which has gone through the first plasma processing process into a second vacuum processing chamber in a non-oxidizing atmosphere including vacuum; a second plasma processing of the substrate with a second plasma formed in the second vacuum processing chamber; and a second switching over of a potential distribution in the second processing chamber to a sub-potential distribution for pushing dust particles stagnating near the main surface of the substrate toward the outer periphery of the substrate.

(C) More specifically, the above first plasma processing is a plasma etching for patterning an upper layer of a laminate film deposited on a semiconductor wafer substrate using a mask resist pattern formed on the upper layer, and the second plasma processing is a plasma etching for patterning a lower layer of the laminate film which underlies the upper layer, using as a mask the same resist pattern and the pattern of the upper layer without breaking the vacuum for cleaning.

(D) After the above first plasma processing etches a lower resist film deposited beneath the above mentioned mask resist pattern, the second plasma etching uses the mask resist pattern and the lower resist film as a mask.

(E) A first plasma processing applies to a workpiece substrate, a first plasma formed in a first processing chamber containing the substrate; thereafter a first potential distribution is switched over to a sub-potential distribution for pushing dust particles stagnating near a main surface of the substrate toward the outer periphery of the substrate; then the substrate which has gone through the first plasma processing is conveyed into a second processing chamber in a non-oxidizing atmosphere including vacuum; a second plasma processing applies to the substrate a second plasma formed in the second processing chamber at a second potential distribution that is then switched over to a sub-potential distribution for pushing out the dust particles stagnating near the main surface of the substrate toward the outer periphery of the substrate; then the substrate which has gone through the second plasma processing is conveyed into a third processing chamber in a non-oxidizing atmosphere including vacuum; a third plasma processing applies to the substrate a third plasma formed in the third processing chamber at a third potential distribution which is switched over to a sub-potential distribution for pushing out the dust particles stagnating near the main surface of the substrate toward the outer periphery of the semiconductor wafer.

(F) The plasma etching for patterning a middle resist film of a three-layer resist film on a semiconductor wafer uses a pattern of the upper resist film as a mask; the plasma etching for patterning the lower resist film uses as a mask the patterns of the upper and middle resist films; and the third plasma etching for patterning the film to be processed, uses as a mask the patterns of the upper, middle and lower resist films.

(G) The plasma processing detects the amount and size of dust particles present in a chamber during plasma processing, compares detected data with preset data stored in advance to indicate an upper limit of the amount and the size of dust particles, and forms a sub-potential distribution in the processing chamber when at least either the amount or the size of dust particles in the detected data exceeds the amount or the size of dust particles in the preset data as a result of the comparison.

According to the above a sub-potential distribution applied just before the stop of plasma discharge pushes out negatively charged dust particles stagnating near the main surface of a semiconductor integrated circuit wafer substrate, toward the outer periphery of the wafer, and further removes the dust particles through an exhaust port or the like, so that it is possible to decrease the amount of dust particles deposited on the semiconductor wafer to one-tenth or so that of the conventional plasma processing.

Moreover, the amount of dust particles deposited can be decreased to a great extent, for example, in plasma etching, so in the case where first and second plasma etching processes are to be carried out continuously, it is possible to shift to the second plasma etching process without going through such complicated processes as wet cleaning, resist removing and resist pattern forming and hence without breaking vacuum, after the first plasma etching process.

Further, when first and second plasma etching processes are continuous, since it is not necessary to perform wet cleaning after the first plasma etching, it is no longer required for a plasma etching equipment to be provided with a wet cleaning mechanism, etc., thus permitting reduction in size of the plasma etching equipment.

DETAILED DESCRIPTION OF THE INVENTION

Figure 1:
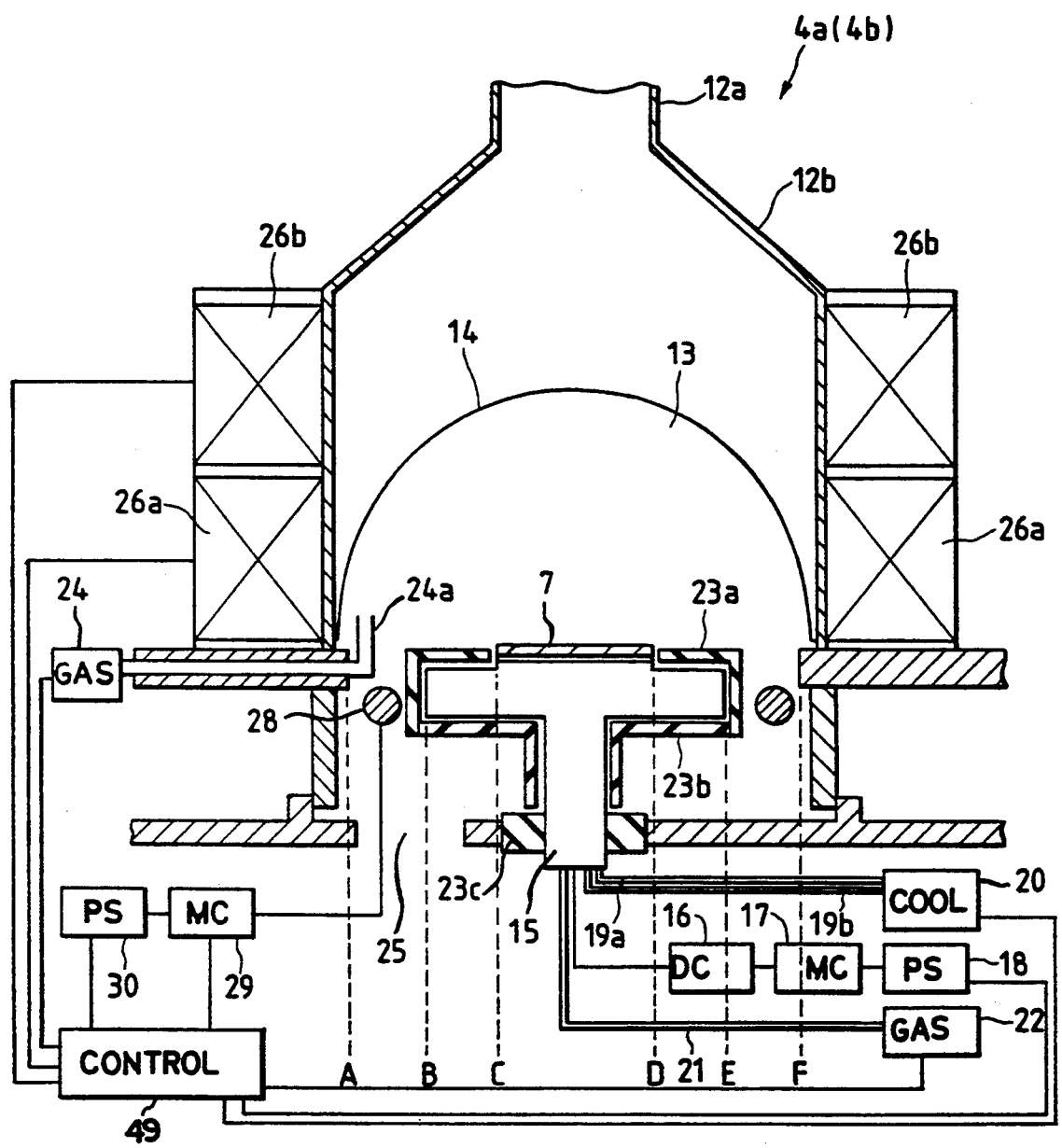
FIG. 1 is a view of a principal portion of a plasma processing equipment according to an embodiment of the present invention.
Figure 2:
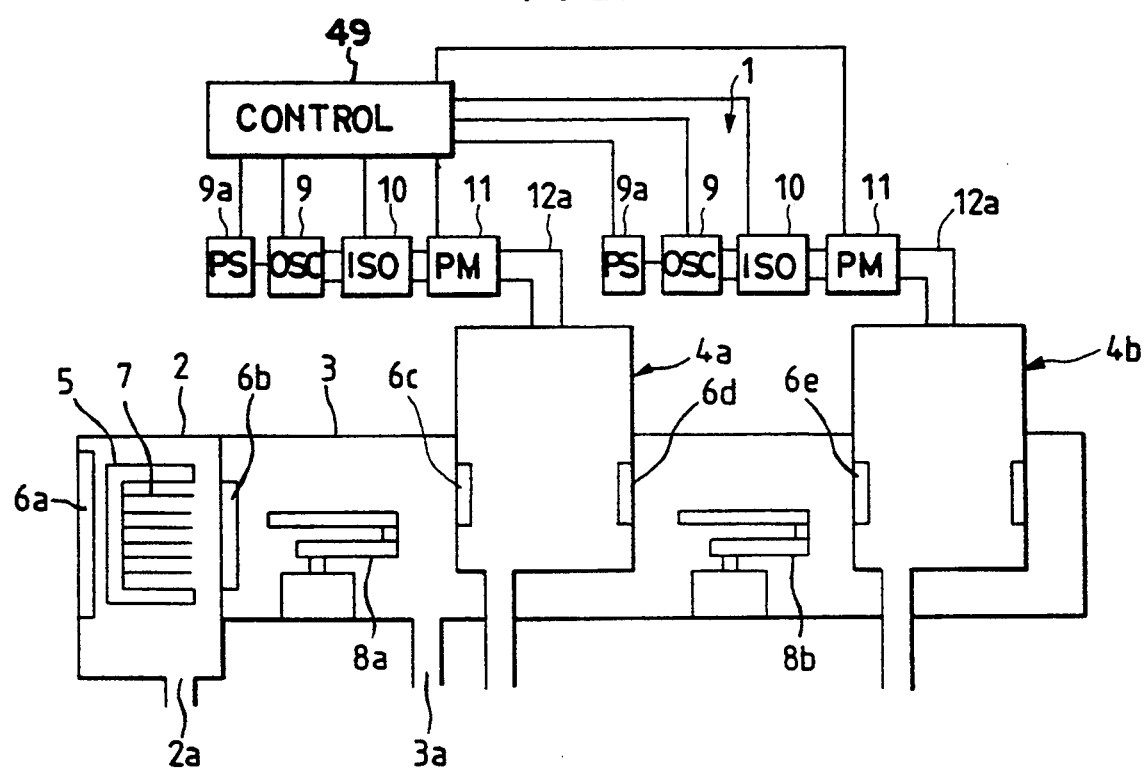
FIG. 2 is a view of an entire construction of the plasma processing equipment of FIG. 1.

The plasma processing equipment of FIGS. 1 and 2 is a single wafer processing type plasma etching equipment used in manufacturing a semiconductor integrated circuit device, for example.

Referring to FIG. 2, the plasma etching equipment 1 has a vacuum load/unload chamber 2, a vacuum conveyance chamber 3 and, at least two-stages of plasma etching chambers 4a, 4b. A wafer cassette 5 is contained in the vacuum load/unload chamber 2. The gases present in the chamber 2 can be exhausted through an exhaust port 2a by means of a vacuum pump (not shown). The wafer cassette 5 is carried into and out of the vacuum load/unload chamber 2 through a sluice valve 6a mounted for opening and closing motion within the chamber 2. The wafer cassette 5 contains a plurality of semiconductor wafers (substrates to be processed) 7. Each semiconductor wafer 7 is formed of a single crystal of silicon (Si), with plural semiconductor chips (not shown) formed on the wafer 7. Also as to the vacuum conveyance chamber 3, like the vacuum load/unload chamber 2, the gases present in the interior thereof can be exhausted through an exhaust port 3a by means of a vacuum pump (not shown). The vacuum conveyance chamber 3 is connected to a gas supply pipe (not shown) for the supply of a non-oxidizing gas such as nitrogen ($N_2$) gas or argon (Ar) gas into the chamber 3.

In the vacuum conveyance chamber 3, a robot arm (conveyance mechanism) 8a is mounted in front of the first plasma etching chamber 4a. The robot arm 8a conveys each semiconductor wafer 7, one by one, from the vacuum load/unload chamber 2 through sluice valve 6b into the plasma etching chamber 4a through a sluice valve 6c. In the vacuum conveyance chamber 3, in front of the second plasma etching chamber 4b, there is mounted a robot arm (conveyance mechanism) 8b. The robot arm 8b conveys each semiconductor wafer 7, one by one, from the first plasma etching chamber 4a through a sluice valve 6d, into the second plasma etching chamber 4b through a sluice valve 6e.

The plasma etching chambers 4a and 4b are each provided with a high voltage power supply (PS) 9a, a magnetron oscillator for main plasma generating (OSC) 9, an isolator (ISO) 10, a power monitor (PM) 11 and a bent waveguide 12a. The magnetron oscillator 9 generates a micro-wave of, for example 2.45 GHz, when a high voltage is applied thereto from the high voltage power supply 9a. The micro-wave generated from the magnetron oscillator 9 is fed to a plasma etching chamber (simply "processing chamber" hereinafter) 13 through the isolator 10, power monitor 11, bent waveguide 12a and a horn-shaped waveguide 12b shown in FIG. 1.

The processing chamber 13 is formed by a discharge tube 14, which in turn is constituted by a dielectric such as, for example, quartz or alumina for passing the microwave therethrough. Under the processing chamber 13 is disposed a lower electrode 15, on which is placed the semiconductor wafer 7 in an electrically insulated state.

The lower electrode (for plasma generating) 15 is electrically connected to a high frequency power supply 18 through a DC power supply (DC) 16 for electrostatic attraction and a matching circuit (MC) 17. A high frequency, for example 400 KHz, signal is applied to the lower electrode 15 from the high frequency power supply (PS) 18. The high frequency power supply 18 generates DC bias over the lower electrode 15 in plasma etching, whereby the incident energy of ions in the plasma, etc. can be controlled independently and hence it is possible to control the etching shape, etc. for the film to be processed.

The lower electrode 15 is connected to a circulating cooling mechanism (COOL) 20 through vacuum double pipes 19a and 19b, for reducing the heat of reaction, etc. generated in plasma etching. Further, the lower electrode 15 is connected to a cooling gas introducing mechanism 22 through a gas flow pipe 21, for introducing, for example, cooled helium (He) gas between the opposed faces of the semiconductor wafer 7 and the lower electrode 15 in order to attain a satisfactory thermal contact of the two.

The lower electrode 15 is electrically shielded by insulators 23a–23c.

Process gas which contributes to etching is fed into the processing chamber 13 from a gas introducing mechanism (GAS) 24 through a gas supply pipe 24a. Reaction gas evolved by etching and the portion of the process gas which has not contributed to the etching are exhausted through an exhaust port 25 by means of a vacuum pump.

Along the outer periphery of the discharge tube 14 there are disposed toroidal electromagnets 26a and 26b for main plasma generating, which are stacked in two stages, for example, in a surrounding relation to the discharge tube. The electromagnets 26a and 26b form a magnetic field which intersects the electric field of the micro-wave perpendicularly in the processing chamber 13 in plasma etching to generate an ECR (Electron Cyclotron Resonance) phenomenon. Consequently, it is possible to control electron density distribution and plasma density distribution in the processing chamber 13.

Figure 7:
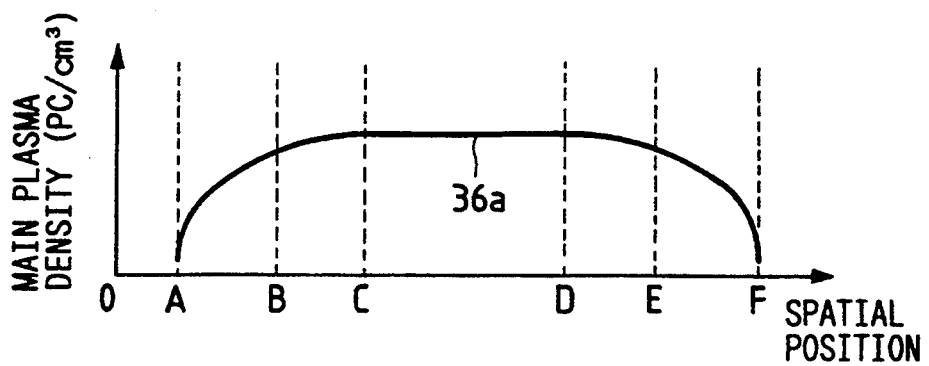
FIG. 7 is a graph showing a plasma density distribution in a processing chamber during the formation of main plasma.
Figure 8:
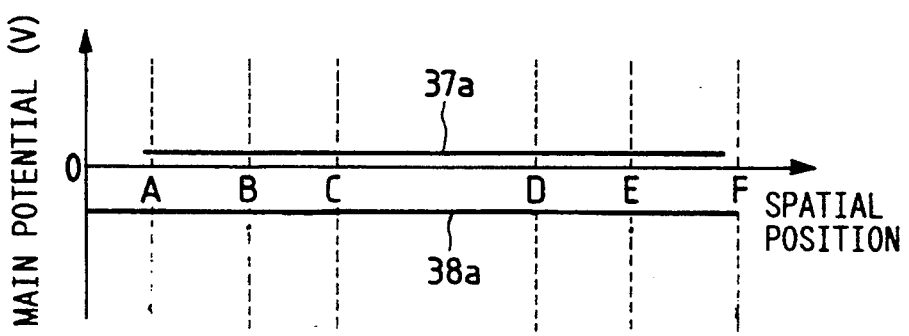
FIG. 8 is a graph showing a main potential distribution in the processing chamber during the formation of main plasma.

In plasma etching, the electromagnets 26a and 26b are controlled so that a mirror field is formed in the processing chamber 13 as will be described later, thereby increasing the electron density, etc. above the main surface of the semiconductor wafer 7 to permit the formation of main plasma of a high density. In the plasma, $IV = V^2/R =$ constant, where I is current, V is voltage and R is resistance. The plasma, to promote satisfactory rates of etching or depositing, has a density that is lower at the periphery than at the center as shown in FIG. 7. A lower density means a higher resistance R, which results in a higher relative negative potential at the periphery as shown in FIG. 8, which keeps the negative dust particles in the center above the wafer. The vacuum pumping system is not sufficient to move the dust particles past the peripheral high potential area.

Figure 3:
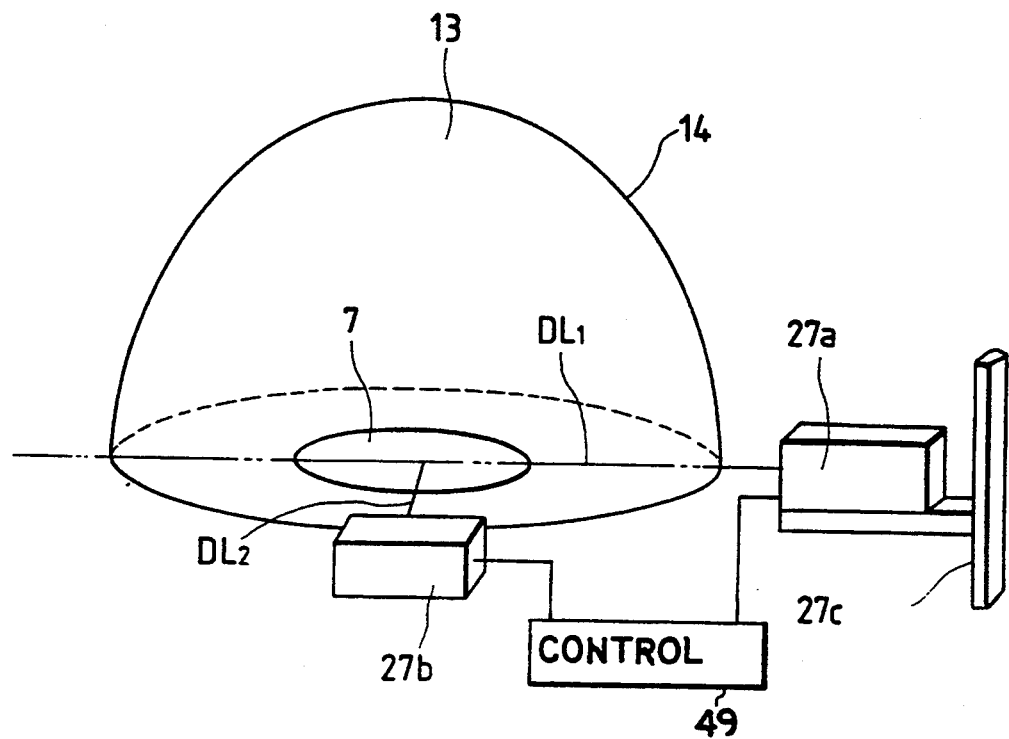
FIG. 3 is a view of a dust particle detecting mechanism in the plasma processing equipment of FIG. 1.

On the outer periphery side of the discharge tube 14 there is a dust particle detecting mechanism, as shown in FIG. 3, which comprises a detection light emitting portion 27a, a reflecting light detecting portion 27b and a height adjusting portion 27c. The detection light emitting portion 27a radiates a dust particle detecting light beam $DL_1$, for example laser light beam, into the processing chamber 13. The beam height can be adjusted by the height adjusting portion 27c, and it is also possible to adjust the incident angle of the dust particle detecting light beam $DL_1$. The reflecting light detecting portion 27b detects scattered light $DL_2$ reflecting from dust particles upon radiation by the dust particle detecting light beam $DL_1$. The thus-detected signal is transmitted to a control section (not shown) which controls the whole plasma etching.

In the processing chamber 13 of each of the plasma etching chambers 4a and 4b, there is a sub-plasma generating electrode 28, for forming a sub-potential distribution, which is ring-like in plan view and extends along the outer periphery of the lower electrode 15. The sub-plasma generating electrode 28 is electrically connected to a sub-high frequency power supply 30 through a matching circuit (MC) 29. A micro-wave voltage, for example 2.45 GHz, is applied to the sub-plasma generating electrode 28 from the sub-high frequency power supply (PS) 30. The high frequency voltage applied to the sub-plasma generating electrode 28 is not limited to the micro-wave voltage of 2.45 GHz. Various changes may be made. For example, it may be a high frequency voltage of 10 MHz or more, for example 13.56 to 100 MHz.

The sub-plasma generating electrode 28 forms, somewhat toroidal sub-plasma, preferably in addition to the main plasma, of a high density along the outer periphery of the negative potential lower electrode 15 and negative potential wafer to control the total plasma density in the processing chamber 13 by increasing density at the periphery, thereby controlling the potential distribution in the chamber to move the negative dust particles to the periphery. Therefore, sub-plasma of a high density is formed on the outer periphery of the lower electrode 15 by the application of a high frequency voltage to the sub-plasma generating electrode 28, whereby there is formed in the processing chamber 13 a sub-potential distribution acting to push out negatively charged dust particles stagnating near the main surface of the semiconductor wafer 7 toward the outer periphery of the wafer.

Moreover, the sub-plasma generating electrode 28 is in a region where the speed of gas flow for the discharge of process gas and reaction gas is high, namely, in a gas exhaust region. This is for exhausting, through the exhaust port 25 to a vacuum pump, the negatively charged dust particles which have been pushed out from near the main surface of the semiconductor wafer 7 and moved to the peripheral portion of the sub-plasma generating electrode 18 as a result of formation of the sub-potential distribution.

Thus, the potential distribution in the processing chamber 13 is controlled by controlling the plasma density distribution in the processing chamber, thereby making it possible to push out the negatively charged dust particles stagnating near the main surface of the semiconductor wafer 7 toward the outer periphery of the lower electrode 15 and the dust particles through the exhaust port 25. The sub-plasma generating electrode 28, matching circuit 29 and sub-high frequency power supply 30 are in each of the plasma etching chambers 4a and 4b.

The broken lines in FIG. 1 indicate spatial positions A to F in the processing chamber 13, which will be referred to later.

A representative plasma etching will be described below with reference to FIGS. 1 to 15 while citing as an example the case where a MOS FET is to be formed on the semiconductor wafer 7.

Figure 4:
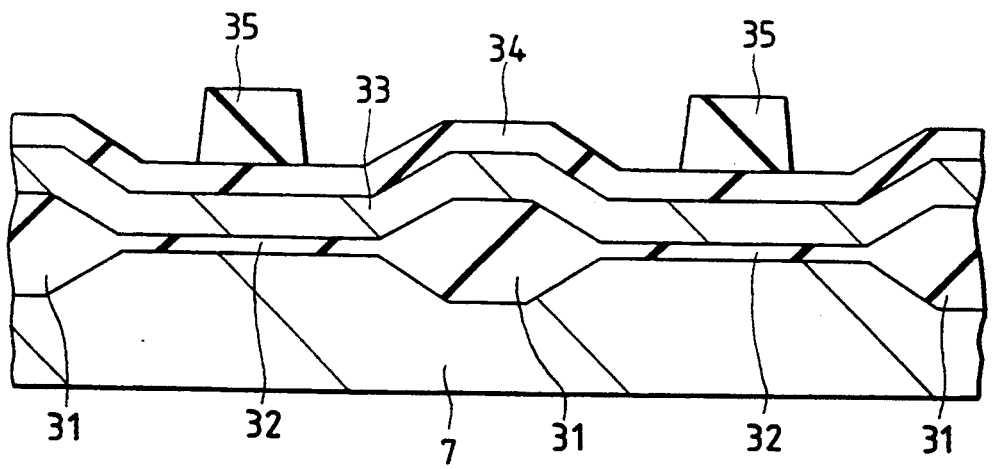
FIG. 4 is a sectional view of a principal portion of a substrate to be processed, before plasma processing.

FIG. 4 shows a section of a principal portion of semiconductor wafer 7 before plasma etching. On the wafer 7, there is formed a field insulating film 31, for example, using silicon dioxide ($SiO_2$) by LOCOS (localized oxidation of silicon). A conductor film 33 of doped polysilicon, about 100-500 nm or so in thickness for example, is deposited on the field insulating film 31 and gate insulating film 32 by hot CVD or another suitable method. On the conductor film 33 is deposited an insulating film 34 for a capacitor using, for example, $SiO_2$ and a hot CVD method. Further, on the insulating film 34 for a capacitor, there are formed resist patterns 35 by photolithography, the resist patterns 35 serving as masks in plasma etching which will be described later.

First, the wafer cassette 5 (see FIG. 2), which contains a plurality of such semiconductor wafers 7, is placed into the vacuum load/unload chamber 2 of the plasma etching equipment 1 through the sluice valve 6a. Then, the interior of the load/unload chamber 2 and that of the vacuum conveyance chamber 3 are evacuated, and thereafter the semiconductor wafers 7 in the wafer cassette 5 are delivered one by one to the robot are 8a in the chamber 3 through the sluice valve 6b. The robot arm 8a conveys each wafer 7 thus delivered to the first plasma etching chamber 4a through the sluice valve 6c.

Then, in the plasma etching chamber 4a, the insulating film 34 for the cap formed over the wafer 7 is subjected to patterning, using the resist patterns 35 as masks, by the following plasma etching, for example.

First, the semiconductor wafer 7 is placed in an appropriate position on the lower electrode 15 shown in FIG. 1, then the sluice valve 6c is closed and the gas present in the processing chamber 13 is exhausted to a vacuum pump through the exhaust port 25 to bring the interior of the chamber 13 into high vacuum. Subsequently, a gaseous mixture of a freon gas, for example, $CF_4$, $CHF_3$, $CH_2F_2$, $C_2F_6$, $C_3F_8$, $C_4F_{10}$ or $C_4F_8$ and an additive gas, for example, $O_2$, Ar or He, is fed into the processing chamber 13 through the gas supply pipe 24a. At this time, the total gas flow rate is set at 10 to 100 sccm, for example. Thereafter, the gas pressure is adjusted to, for example, to 0.5 to 10 m Torr.

Figure 5:
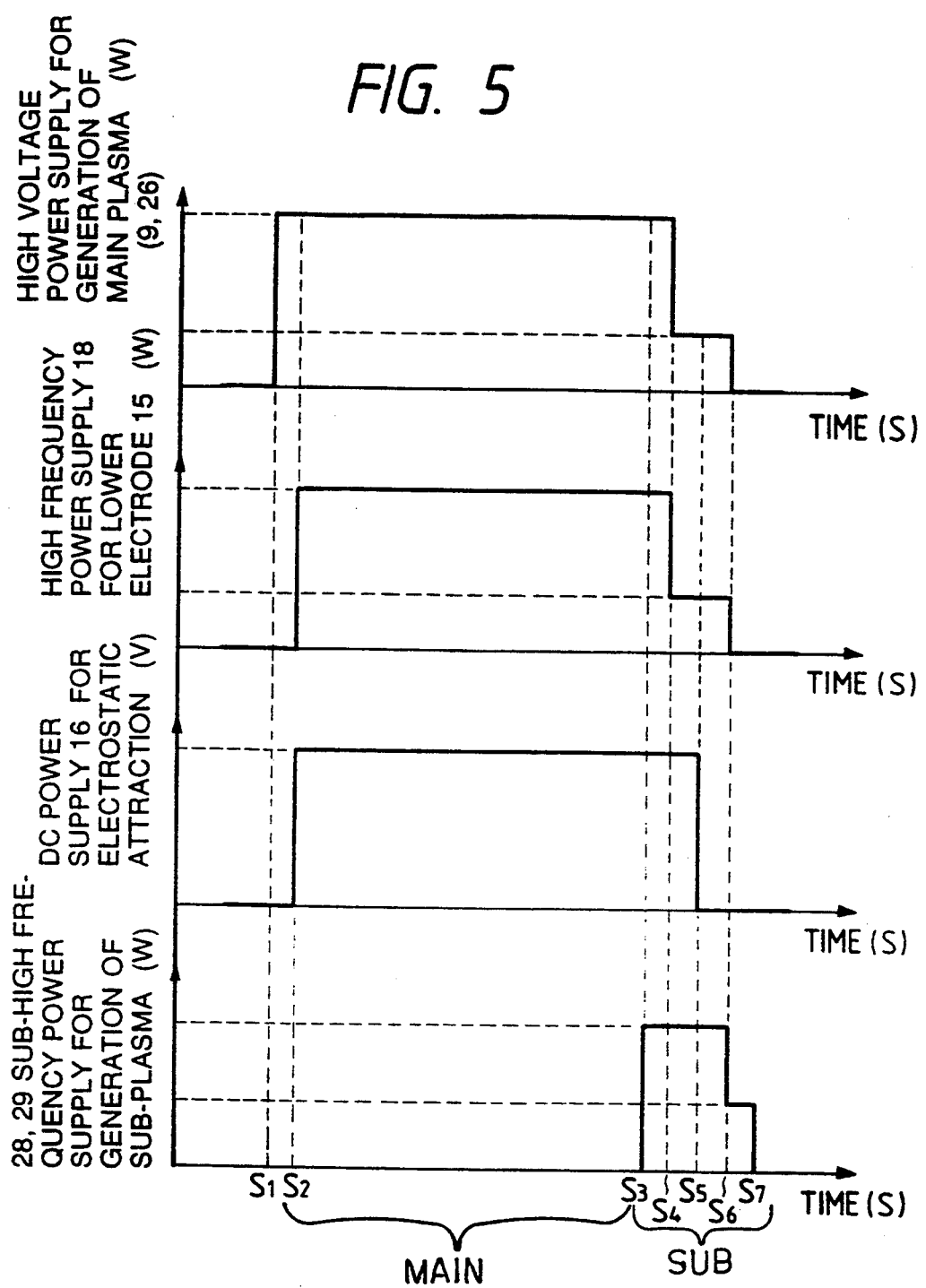
FIG. 5 is a timing chart for explaining power application timings of various constituent portions in plasma processing.

At time $S_1$ in FIG. 5, the high voltage power supply 9a is turned on to start the operation of the magnetron oscillator 9 and at the same time the electromagnets 26a and 26b are operated. At this time, the frequency of the microwave generated from the magnetron oscillator 9 is, for example, 2.45 GHz, and the input power is, for example, 400 W to 2000 W.

Figure 6:
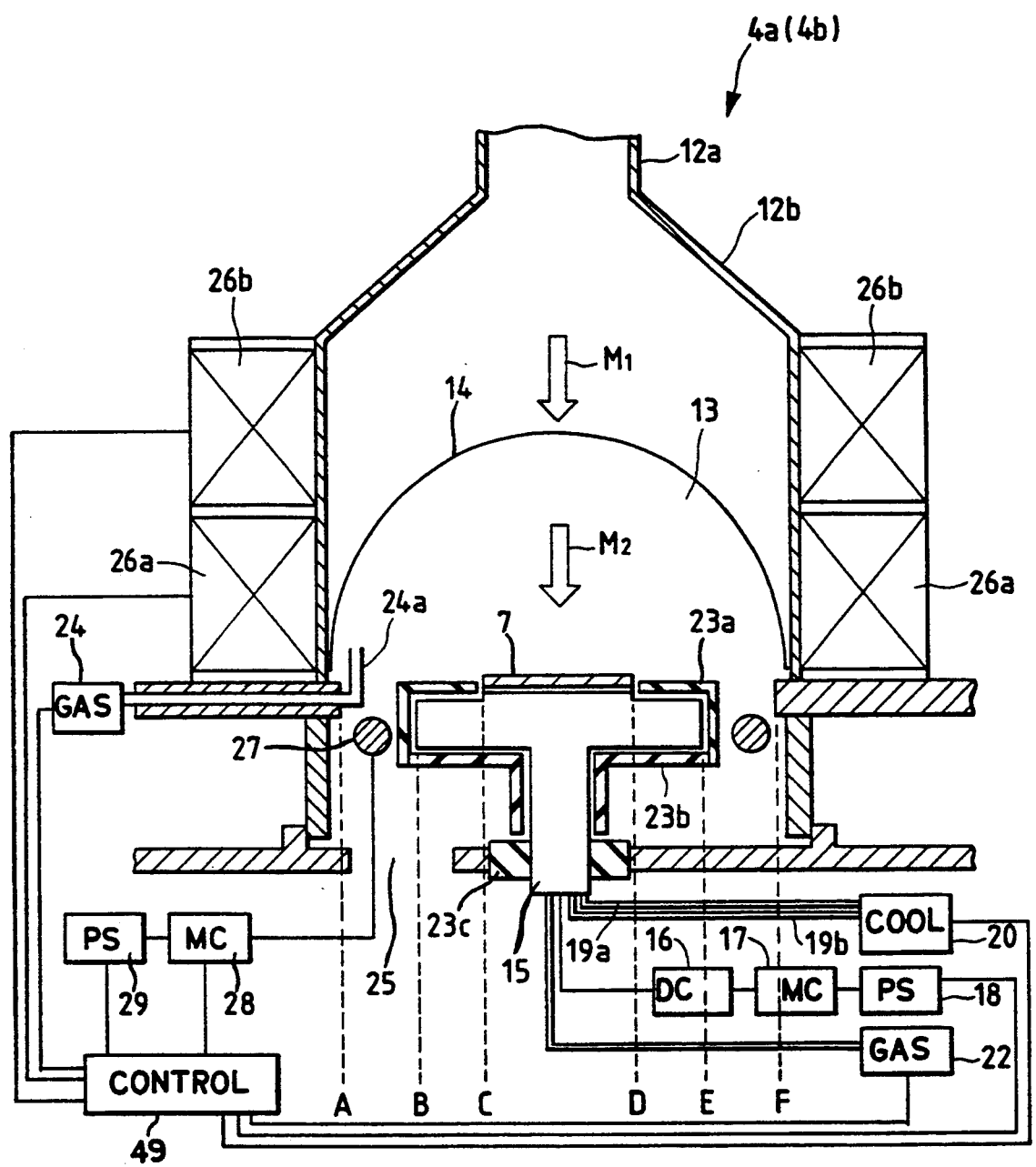
FIG. 6 is a view for explaining the state of a magnetic field in plasma processing.

As shown in FIG. 6, the electromagnets 26a and 26b are set so that the magnetic lines of force of magnetic fields $M_1$ and $M_2$ formed by those electromagnets face in the same direction, that is, a mirror field is formed in the processing chamber 13. Adjustment is made so that the maximum flux density of each of the magnetic fields $M_1$ and $M_2$ is, for example, in the range of 1000 to 2000 gauss. In this way, the process gas in the processing chamber 13 is excited for decomposition into ions, electrons and radicals to form main plasma for etching. At this time, a high-density main plasma is formed by an extreme increase in electron density, etc. in a spatial ECR plane wherein the electric field induced by the micro-wave and the magnetic fields by the electromagnets 26a, 26b satisfy the ECR condition.

After the main plasma has become stable, at time $S_2$ in FIG. 5, a high frequency voltage is applied to the lower electrode 15 from the high frequency power supply 18, and at the same time, the DC power supply 16 for electrostatic attraction is started. At this time, the frequency of the high frequency voltage applied to the lower electrode 15 is, for example, in the range of 400 KHz to 13.56 MHz, and the input power is, for example, 50 W to 1000 W. At the same time, for reducing the heat of reaction generated by plasma processing, the circulative cooling mechanism 20 is operated to introduce a circulating cooling fluid into the lower electrode 15 through the vacuum double pipes 19a and 19b. At this time, the temperature of the cooling fluid is set at a value in the range of, for example, $-60°$ to $50°$ C. Further, the cooling gas introducing mechanism 22 is started, allowing He gas or the like to flow into the space between the opposed faces of the semiconductor wafer 7 and the lower electrode 15, thereby keeping the wafer and the electrode in good thermal contact with each other. Upon application of a high frequency voltage to the lower electrode 15, a DC bias is generated in the lower electrode, whereby the ions in the main plasma are drawn out, accelerated and directed to the semiconductor wafer 7 on the lower electrode 15. In this way, plasma etching is started.

A main plasma density distribution and a main potential distribution in the processing chamber 13 during this etching process are shown in FIGS. 7 and 8, respectively. Spatial positions A to F in FIGS. 7 and 8 correspond to the spatial positions A to F in FIG. 1. As shown in FIG. 7, the main plasma density distribution at this time, indicated at 36a, is an upwardly convex distribution. That is, above the lower electrode 15 in the processing chamber 13 there is formed a main plasma whose density is higher in the central region than in the peripheral region above the electrode. At this time, a potential distribution in the interface between the main plasma and the ion sheath, namely, a plasma potential distribution 37a, is a substantially flat distribution (where the dust is held), as shown in FIG. 8. On the other hand, a potential distribution 38a at the upper surface of the lower electrode 15 is stronger in the peripheral region than in the central region of the lower electrode.

At this time, for example, the width of the ion sheath is 1 to 10 mm, the plasma potential is 5 V to the 20 V, the upper surface potential of the lower electrode 15 in the spatial positions A and F is $-1000$ V, and the upper surface potential of the lower electrode 15 in the spatial positions C to D is $-100$ V to $-500$ V.

The dust particles generated during etching are usually charged negatively and are influenced by the electric field induced by the difference between the plasma potential and the upper surface potential of the lower electrode 15. In the main potential distribution (plasma potential distribution 37a and potential distribution 38a) shown in FIG. 8, since the negative electric field in the outer peripheral region of the lower electrode 15 is stronger than that in the central region thereof, the negatively charged dust particles are pushed to the central region of the lower electrode, namely, just above the semiconductor wafer 7, and they stagnate in a sandwiched state between the main plasma and the ion sheath.

Figure 9:
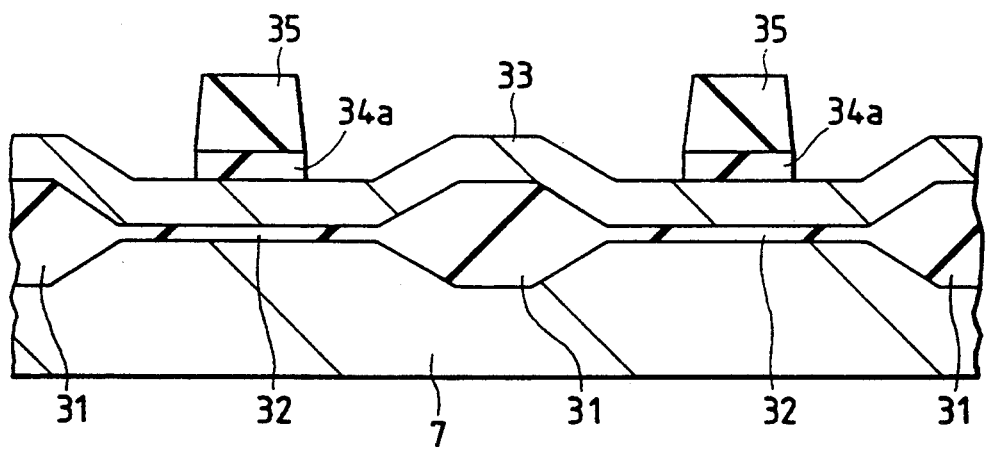
FIG. 9 is a sectional view of a principal portion of the substrate after a first plasma processing.

The plasma etching is continued for a predetermined time in the above manner until an insulating film pattern 34a for preventing shorting between first and second gates, as a cap shown in FIG. 9, is formed.

At this time, indicated at $S_3$ in FIG. 5, the following processing is started.

First, a high frequency voltage is applied to the sub-plasma generating electrode 28 from the sub-high frequency power supply 30 to form sub-plasma of a high density around the lower electrode 15. At this time $S_3$, however, both the high voltage power supply 9a for main plasma and the high frequency power supply 18 for the lower electrode 15 are continued to be supplied with electric power. This is because if the plasma discharge is stopped, the dust particles stagnating near the main surface of the semiconductor wafer 7 will fall and adhere onto the main surface of the wafer. For example, the frequency of the high frequency voltage applied to the sub-plasma generating electrode 28 is 2.45 GHz in the form of a micro-wave, and the input power is 1000 W to 2000 W.

However, the frequency of the high frequency voltage applied to the sub-plasma generating electrode 28 is not limited to 2.45 GHz. Various changes may be made. For example, a high frequency of 13.56 to 100 MHz may be used.

Figure 10:
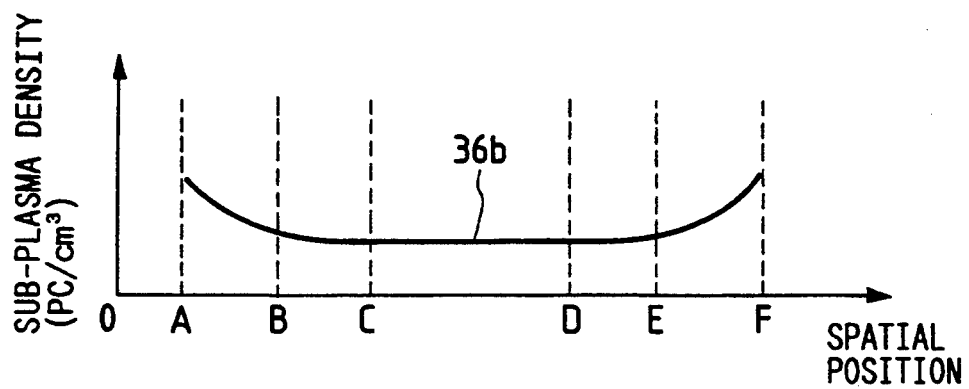
FIG. 10 is a graph showing a plasma density distribution in the processing chamber during the formation of sub-plasma.
Figure 11:
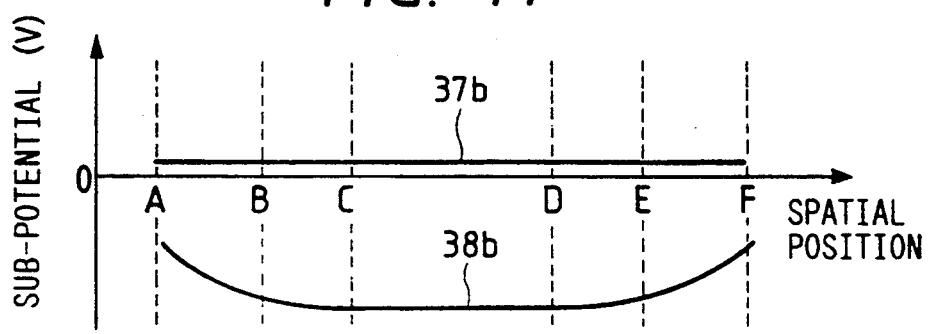
FIG. 11 is a graph showing a sub-potential distribution in the processing chamber during the formation of sub-plasma.

Then, at time $S_4$ which corresponds to a stabilized time point of sub-plasma, the electric power of the high voltage power supply 9a for generation of main plasma and the electric power of the high frequency power supply 18 for the lower electrode 15 are dropped to a level at which the plasma discharge does not stop and there will not occur a plasma etching reaction. A sub-plasma density distribution and a sub-potential distribution in the processing chamber 13 at this time are shown in FIGS. 10 and 11, respectively. Spatial positions A to F in FIGS. 10 and 11 correspond to the spatial positions A to F in FIG. 1.

As shown in FIG. 10, a sub-plasma density distribution 36b is a downwardly convex distribution. That is, in the peripheral region of the lower electrode 15 in the processing chamber 13 there is formed a sub-plasma whose density is higher than that in the central region of the electrode 15. At this time, a potential distribution in the interface between the sub-plasma and the ion sheath, namely, a plasma potential distribution 37b, is a substantially flat distribution, as shown in FIG. 11. On the other hand, a potential distribution 38b at the upper surface of the lower electrode 15, including the main surface of the semiconductor wafer 7, is a downwardly convex distribution. In this case, therefore, a negative electric field induced by the difference between the plasma potential and the upper surface potential of the lower electrode 15 is stronger in the central region than in the peripheral region of the lower electrode.

At this time, for example, the width of the ion sheath is 1 to 10 mm, the plasma potential is 5 V to 20 V, the upper surface potential of the lower electrode 15 in the spatial positions C to D is $-1000$ V, and the upper surface potential of the lower electrode 15 in the spatial positions A and F is $-100$ V to $-500$ V.

In the sub-potential distribution (plasma potential distribution 37b and potential distribution 38b) shown in FIG. 11, since the negative electric field in the central region of the lower electrode 15 is stronger than that in the peripheral region thereof, the negatively charged dust particles which were stagnating near the main surface of the semiconductor wafer 7 during etching are subjected to a force acting to radially push out the dust particles toward the outer periphery of the wafer 7 and so gather the dust particles in the vicinity of the sub-plasma generating electrode 28. The negatively charged dust particles thus gathered near the sub-plasma generating electrode 28 are discharged through the exhaust port 25 by means of a vacuum pump because the place where the electrode 28 is mounted is a gas exhaust region of a high gas flowing speed.

Thus, dust particles falling and adhering onto the semiconductor wafer 7 just after the stop of plasma discharge, which dust particles have heretofore occupied about 90% of the dust particles deposited on the wafer 7 throughout the whole plasma processing period, can be removed just before the stop of plasma discharge, namely, prior to falling. Therefore, the amount of the dust particles deposited on the wafer 7 throughout the entire plasma etching period can be reduced to one-tenth or so of the conventional process and hence it is possible to greatly reduce the defect density caused by the dust particles.

Thereafter, at time $S_5$ (see FIG. 5) corresponding to a completed time point of the dust particle removing process using sub-plasma, the supply of electric power from the DC power supply 16 and the operation of the cooling gas introducing mechanism 22 are stopped.

At time $S_6$ in FIG. 5, the supply of electric power from the high voltage power supply 9a for generation of main plasma and the supply of electric power from the high frequency power supply 18 for the lower electrode 15 are stopped to terminate the plasma etching process of the insulating film 34 (see FIG. 4) on the semiconductor wafer 7. At time S₇, the electric power for generating sub-plasma is stopped after having been reduced at time S₆.

Since the dust particles stagnating near the main surface of the semiconductor wafer 7 during plasma etching can be removed before falling onto the wafer, a shift to the plasma etching process for the conductor film 33 (see FIG. 9) can be made in the following manner.

First, the semiconductor wafer 7 which has gone through the plasma etching process for the insulating film 34 is delivered to robot arm 8b in the vacuum conveyance chamber 3 through the sluice valve 6d (see FIG. 2) in the plasma etching portion 4a. Then, the robot arm 8b conveys the wafer 7 into the second plasma etching portion 4b through the sluice valve 6e.

Thus, a shift to the plasma etching process for the conductor film 33 can be made without going through such complicated processes as wet cleaning, resist removal and the formation of resist pattern and without breaking the vacuum. Consequently, it is possible to decrease the number of processes in continuous plasma etching and the processing time can be shortened. Besides, the processing efficiency of such etching process can be improved to a great extent. Further, since the semiconductor wafer 7 is not contacted with air, it is possible to prevent the deterioration in yield and reliability of the resulting semiconductor integrated circuit device which is caused by oxidation or the adhesion of moisture, for example.

Figure 12:
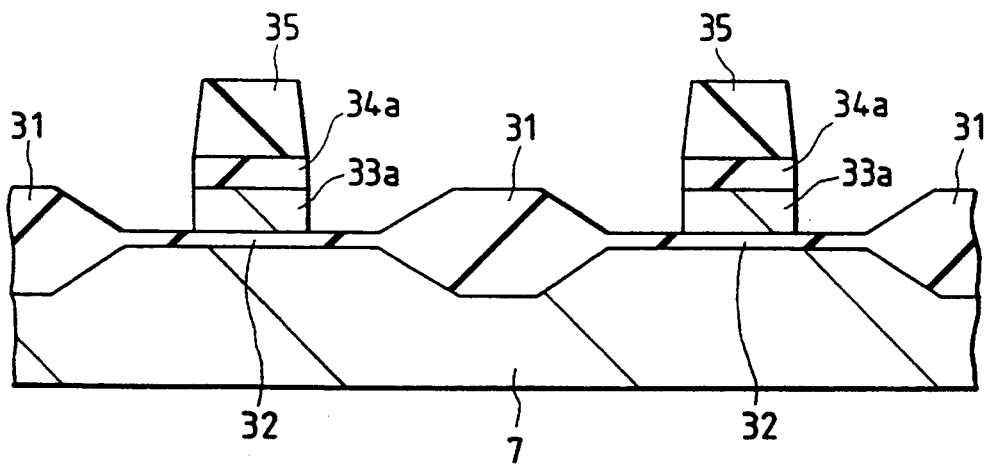
FIG. 12 is a sectional view of the principal portion of the substrate after a second plasma processing.

Thereafter, in the plasma etching portion 4b, the same plasma etching and dust particle removing process as above described are applied to the semiconductor wafer 7, and the conductor film 33 is subjected to patterning, using the resist patterns 35 and the insulating film patterns 34a as masks to form gate electrode patterns 33a, as shown in FIG. 12. In this etching process, a process gas is a gaseous mixture of a halogen gas, for example, $Cl_2$, HBr or $SF_6$ and an additive gas, for example, $O_2$, $N_2$, Ar or He, and the total gas flow rate is, 10 to 200 sccm and the gas pressure is 0.5 Torr to 100 m Torr. The frequency of the micro-wave generated from the magnetron oscillator 9 is 2.45 GHz and the input power is 400 W to 2000 W. The frequency of the high frequency voltage applied to the lower electrode 15 is 400 KHz to 13.56 MHz and the input power is 5 W to 100 W. The maximum flux density of each of the magnetic fields 26a and 26b is adjusted to a value in the range of 1000 to 2000 gauss, for example. The temperature of the circulating cooling fluid is, for example, in the range of −60° to 50° C. The frequency of the high frequency voltage applied to the sub-plasma generating electrode 28 in the dust particle removing process which is carried out just before stopping the plasma discharge is 2.45 GHz in the form of micro-wave and the input power is 500 W to 2000 W.

However, the frequency of the high frequency voltage applied to the sub-plasma generating electrode 28 is not limited to 2.45 GHz. It may be changed to various values. For example, a high frequency of 13.56 to 100 MHz may be used.

Thus, the amount of dust particles deposited on the semiconductor wafer 7 can be decreased to about one-tenth or less of that of the conventional process even in the plasma etching period for the conductor film 33 formed of doped polysilicon, to greatly decrease the defect density caused by dust particles.

Figure 13:
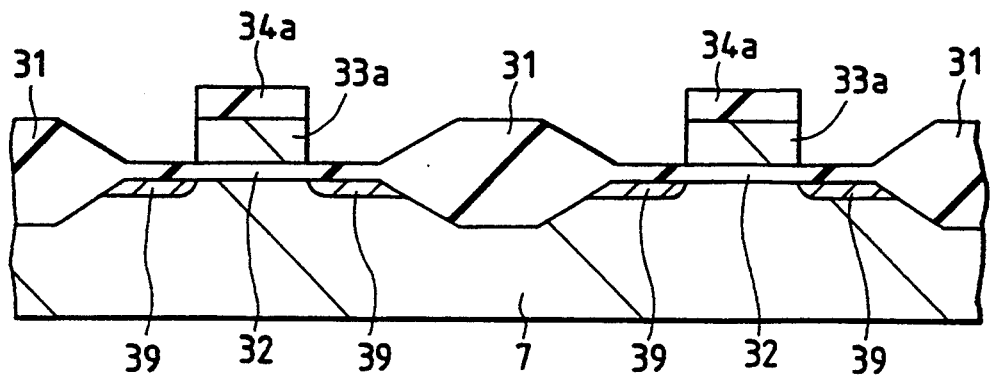
FIG. 13 is a sectional view of the principal portion of the substrate, explaining a manufacturing process for a semiconductor integrated circuit device after the second plasma processing.
Figure 14:
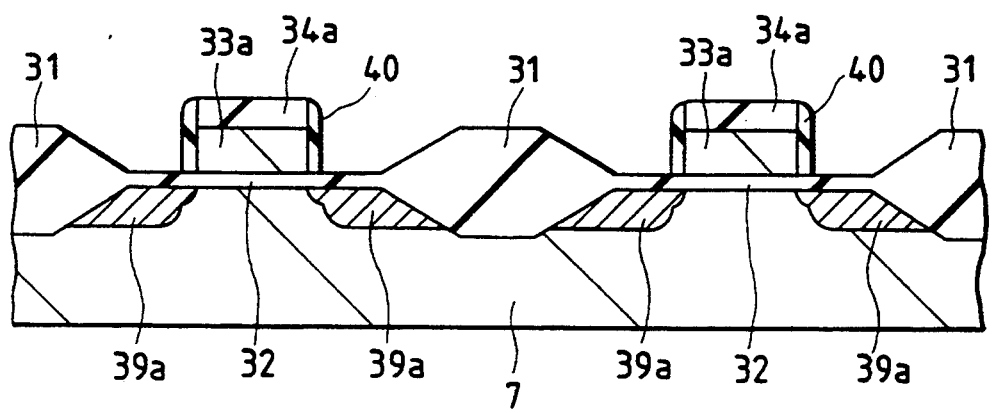
FIG. 14 is a sectional view of the principal portion of the substrate, explaining a manufacturing process for the semiconductor integrated circuit device which follows the process shown in FIG. 13.
Figure 15:
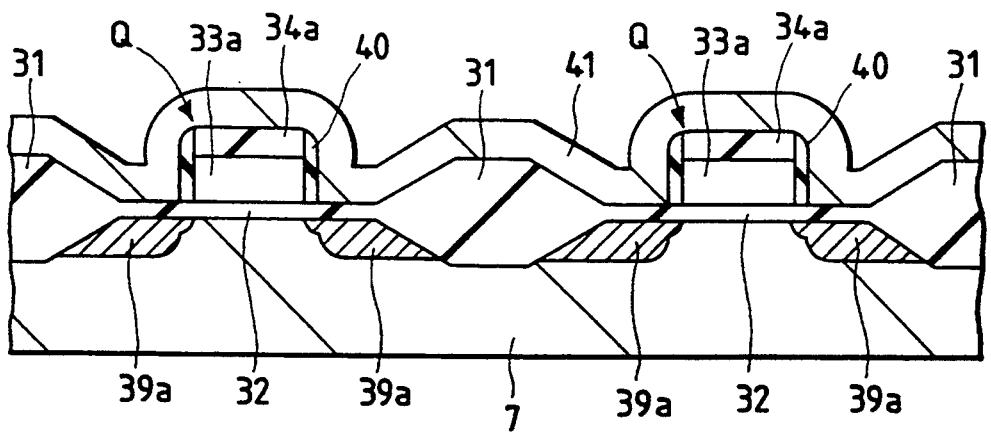
FIG. 15 is a sectional view of the principal portion of the substrate, explaining a manufacturing process for the semiconductor integrated circuit device which follows the process shown in FIG. 14.

Subsequent processes are the same as in the conventional method. That is, first, the semiconductor wafer 7 is taken out from the plasma processing equipment 1, and the resist pattern 35 is removed. Then, as shown in FIG. 13, ions of a predetermined impurity are implanted in the main surface of the wafer 7, using the insulating film pattern 34a and the gate electrode pattern 33a as masks for ion implantation, to form thin diffused layers 39. Subsequently, as shown in FIG. 14, side walls 40 are formed and thereafter ions of a predetermined impurity are again implanted in the main surface of the wafer 7, using the insulating film pattern 34a and the gate electrode pattern 33a as masks for ion implantation, to form diffused layers 39a, thus forming a MOS transistor Q of LDD (Lightly Doped Drain) structure. Thereafter, as shown in FIG. 15, a conductor film 41 formed of doped polysilicon for the formation of a capacitor, for example, is deposited on the semiconductor wafer 7 to form a predetermined semiconductor integrated circuit device on the wafer.

According to this embodiment 1 there can be attained the following effects.

(1) In plasma etching, after the completion of the etching process and just before the stop of plasma discharge, a high frequency voltage is applied to the second plasma generating electrode 28 to form a sub-potential distribution acting to push out the dust particles stagnating near the main surface of the wafer 7 toward the outer periphery of the wafer, in place of or in addition to the main potential distribution formed in the etching process, thereby removing the dust particles through the exhaust port 25, whereby the amount of dust particles deposited on the wafer 7 throughout the whole plasma etching period can be decreased to about one-tenth of the prior art and hence it is possible to greatly diminish the defect density caused by dust particles.

(2) As a result of the above (1) it is no longer required to subject the semiconductor wafer 7 to wet cleaning after plasma etching of the insulating film 34. That is, it becomes possible to omit the wet cleaning process after plasma etching.

(3) As a result of the above (2) it is possible to eliminate the problem of wafer absorption of the resist pattern 35 and the resulting deterioration in the stability of plasma, so it is no longer necessary to provide a process for removing the resist pattern 35. In other words, it is possible to omit the resist pattern 35 removing process after plasma etching.

(4) As a result of the above (3) it becomes possible to use the resist pattern 35 as a mask in the subsequent plasma etching for the conductor film 33. Consequently, it is no longer required to provide a process (including exposure, development and drying) for forming a new resist pattern in patterning the conductor film 33. That is, it becomes possible to omit the resist pattern forming process after plasma etching.

(5) As a result of the above (2)–(4), after plasma etching for the insulating film 34, a shift to the next plasma etching for the conductor film 33 can be made without going through such complicated processes as wet cleaning, resist removal and the formation of resist pattern and hence without breaking the vacuum.

(6) As a result of the above (2)–(5), the number of processes in patterning the insulating film 34 and the conductor film 33 continuously by plasma etching can be decreased and the processing time can be shortened, thus permitting a great improvement of the processing efficiency.

(7) As a result of the above (2) it becomes possible to reduce the size of the plasma etching equipment 1 because it is not necessary to provide a wet cleaning mechanism, etc.

(8) As a result of the above (5) it becomes possible to prevent the variation in size of elements caused by oxidation, etc. because the semiconductor wafer 7 is not contacted with air after plasma etching for the insulating film 34.

(9) As a result of the above (5), since the wafer 7 is not contacted with the air after plasma etching for the insulating film 34, it is possible to prevent the phenomenon of adhesion of moisture, etc. to the semiconductor wafer 7 and also prevent the phenomenon of plasma becoming unstable due to such moisture in the subsequent plasma etching for the conductor film 33. Consequently, it is possible to effect plasma etching to a satisfactory extent.

(10) As a result of the above (1), (8) and (9) it becomes possible to greatly improve the production yield and reliability of the semiconductor integrated circuit device.

[Embodiment 2]

Figure 16:
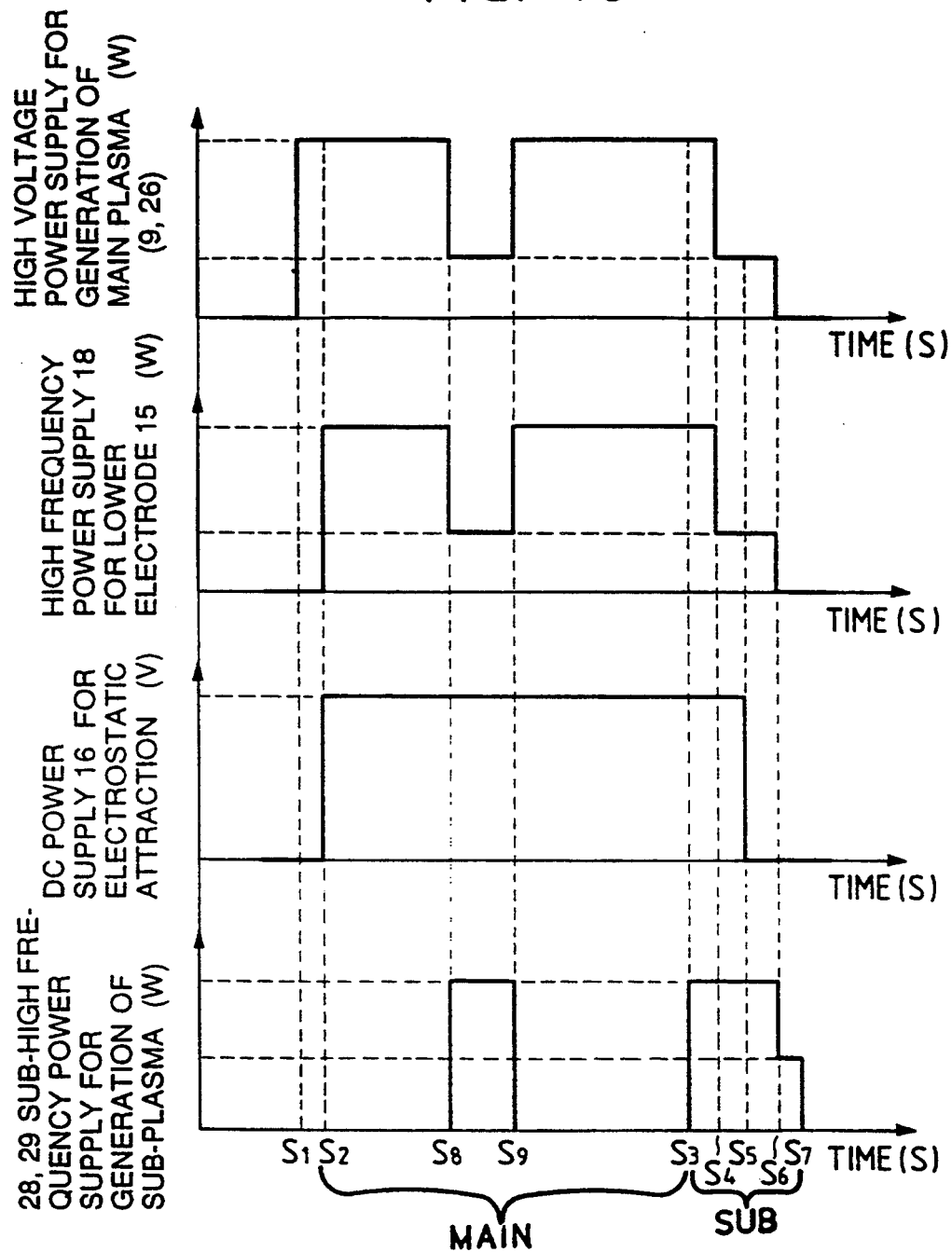
FIG. 16 is a timing chart showing the power application timings of various constituent portions for explaining plasma processing according to another embodiment of the present invention.

FIG. 16 is a timing chart explanatory of power application timings of various constituent portions of a plasma processing equipment for explaining a plasma processing method according to another embodiment of the present invention.

Although an explanation has been made in the previous embodiment 1 about the case where the removal of dust particles is performed by controlling the potential distribution in the processing chamber just before stopping the plasma discharge, this is only a preferred embodiment. Dust particles may be removed by controlling the potential distribution in the processing chamber during plasma etching. In this Embodiment 2, which includes all of Embodiment 1, an example of removing dust particles by controlling the potential distribution in the processing chamber during plasma etching will be described below with reference to FIGS. 1 to 16.

First, in the Embodiment 2, like the Embodiment 1, plasma etching is started at time $S_1$ shown in FIG. 16.

In the Embodiment 2, the amount and size of dust particles stagnating near the main surface of the semiconductor wafer 7 are detected repeatedly or periodically at predetermined time internals by the dust particle detecting mechanism 27 shown in FIG. 3 and the thus-detected signals are transmitted to the foregoing control 49. On the basis of the detected signals transmitted from the dust detecting mechanism 27, the control 49, which may be a programmed computer, calculates such data as the amount and size of dust particles present in the processing chamber 13 at the time of the detection, and compares the calculated data with preset data stored in advance and indicating upper limits of the amount and size of dust particles.

It is here assumed that the amount and size of dust particles detected at time $S_8$ shown in FIG. 16 exceeds the amount and size of dust particles in the preset data and that the control 49 judged a possible falling of the dust particles onto the semiconductor wafer 7. In this case, the control 49 turns on the sub-high frequency power supply 30 for generation of sub-plasma, reduces the electric power of high voltage power supply 9a and that of the high frequency power supply 18, forms the sub-plasma explained in the previous embodiment 1, and starts the removal of dust particles. Therefore, the dust particles stagnating near the main surface of the semiconductor wafer 7 can be removed during plasma etching.

The control 49 performs a dust particle removing processing using the sub-plasma for a predetermined time $S_8$ to $S_9$, for example, in such a manner that the sub-potential distribution of sub-plasma does not impair the uniformity and selectivity of etching using main plasma, nor does it badly influence the semiconductor wafer 7, for example damage of the wafer, and that the plasma processing performance required for the wafer 7 is not impaired. Thereafter, at time $S_9$ which is a completion time of the dust particle removing process, the control 49 restores the amount of electric power supplied to the high voltage power supply 9a for generation of main plasma and that supplied to the high frequency power supply 18 for the lower electrode 15 to the original state and stops the supply of electric power to the sub-high frequency power supply 30 for generation of sub-plasma, to restore the potential distribution in the processing chamber 13 to the original main potential distribution.

Thereafter, the plasma etching process is continued until the final stage, in which stage the dust particle removing process is again carried out using sub-plasma just before the stop of plasma discharge, as in the embodiment 1, and the plasma etching process for the insulating film 34 is completed.

Thus, according to this embodiment 2, there can be attained the following effect in addition to the effects obtained in the embodiment 1. By controlling the potential distribution in the processing chamber 13 during plasma etching and removing dust particles, it is possible to decrease the amount of dust particles deposited on the semiconductor wafer 7 throughout the whole plasma processing period to a larger extent than in the embodiment 1. As a result, the defect density on the wafer 7 caused by the depositing of dust particles can be lowered to a great extent and thus it is possible to greatly improve the production yield and reliability of the semiconductor integrated circuit device. [Embodiment 3]

Figure 17:
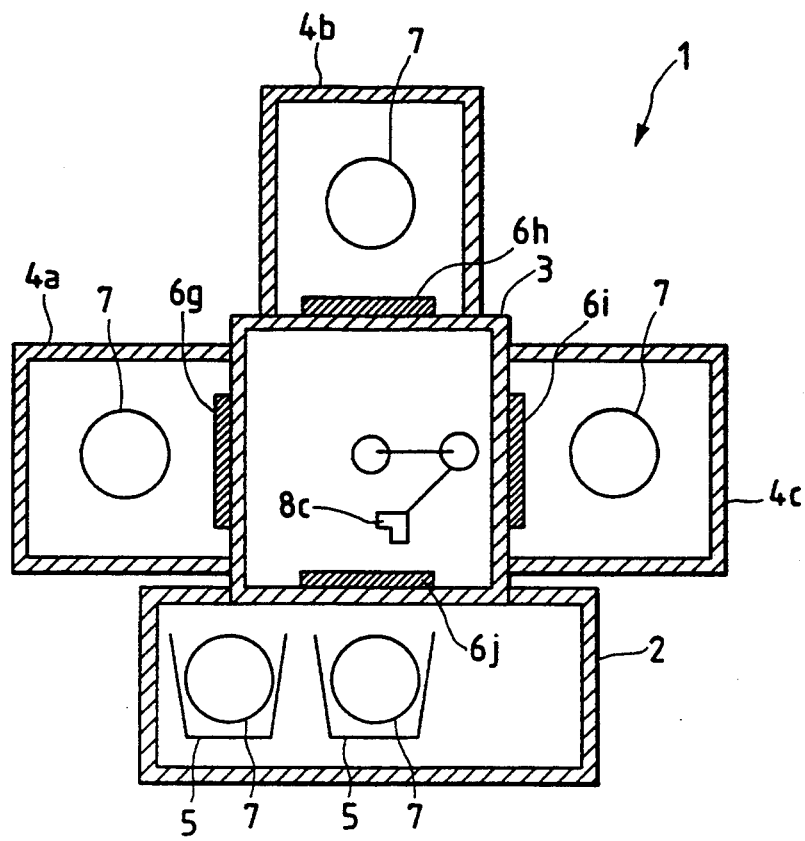
FIG. 17 is a view of a plasma processing equipment according to a further embodiment of the present invention.

FIG. 17 is a view explanatory of a plasma processing equipment according to a further embodiment of the present invention, and FIGS. 18 to 21 are sectional views of a principal portion of a substrate to be processed in a plasma etching process using a three-layer resist film.

For example, as shown in FIG. 17, the plasma processing equipment of this embodiment 3 includes all the structure and other features of Embodiments 1 and 2, and is a three-chamber type plasma etching equipment 1. Around a vacuum conveyance chamber 3 of the plasma etching equipment 1 there are disposed three plasma etching chambers 4a and 4c and a vacuum load-/unload chamber 2. The vacuum conveyance chamber 3 and the plasma etching chamber 4a-4c are connected together mechanically through sluice valves 6g-6i. The vacuum conveyance chamber 3 and the vacuum load-/unload chamber 2 are mechanically connected with each other through a sluice valve 6j. The plasma etching portions 4a to 4c are of the same structure as the plasma etching portions 4a and 4b described in the embodiment 1. Within the vacuum conveyance chamber 3 is mounted a robot arm (conveyance mechanism) 8c to permit the conveyance of a semiconductor wafer 7.

A plasma processing method according to this embodiment 3 will be described below with reference to FIGS. 17 to 21 while citing as an example an etching process using a three-layer resist film for a semiconductor integrated circuit device.

Figure 18:
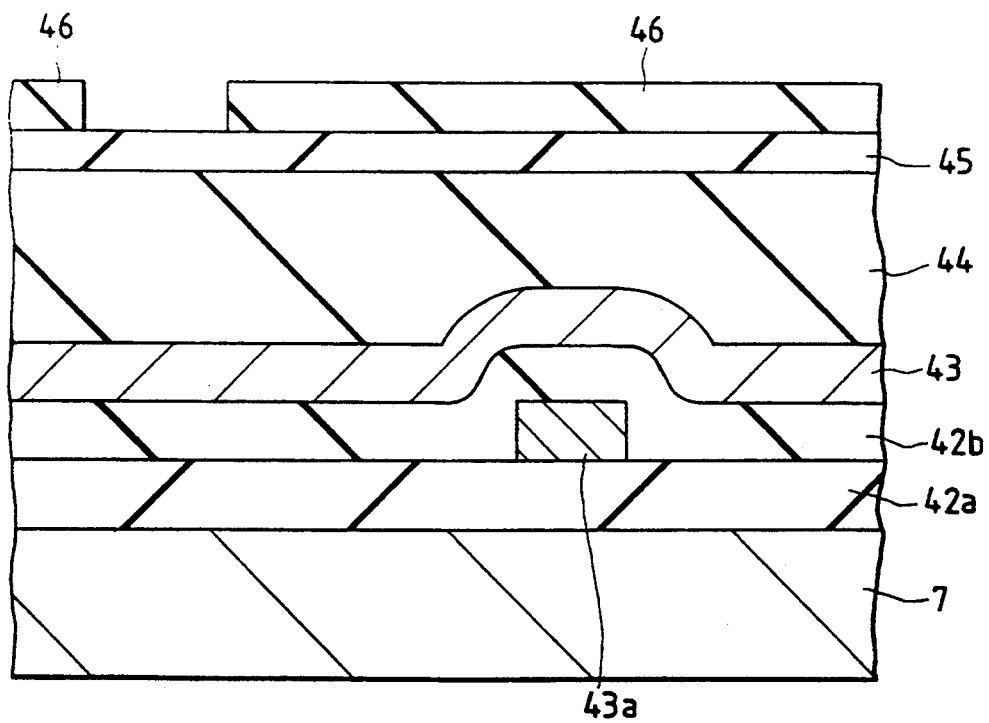
FIG. 18 is a sectional view of a principal portion of a substrate to be processed in plasma etching using a three-layer resist film.

FIG. 18 illustrates a section of a principal portion of a semiconductor wafer 7 contained in a wafer cassette 5. On the wafer 7 is deposited an inter-layer insulating film 42a of $SiO_2$ by CVD, for example. On the inter-layer insulating film 42a are deposited a first wiring pattern 43a formed of, for example, aluminum (Al) or Al alloy and an inter-layer insulating film 42b which covers the first wiring pattern 43a. On the inter-layer insulating film 42b is deposited a conductor film 43 of Al or Al alloy for forming a second wiring pattern which will be described later. Deposited on the conductor film 43 is a lower resist film 44 formed of organic material, for example. Deposited on the lower resist film 44 is an intermediate resist film 45 formed of, for example, $SiO_2$, Si, or silicon nitride ($Si_3N_4$). Further, on the intermediate resist film 45 is formed an upper resist film pattern 46 as an ordinary resist film by patterning according to a photolithographic technique.

Figure 19:
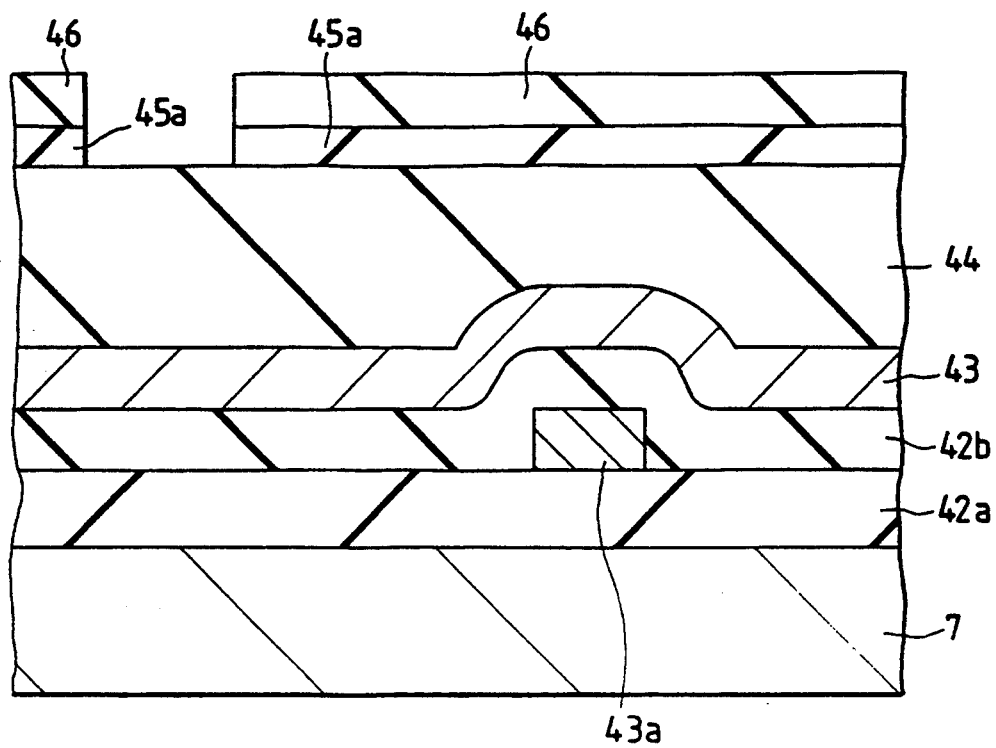
FIG. 19 is a sectional view of the principal portion of the substrate in plasma etching using the three-layer resist film which follows the process shown in FIG. 18.

In this embodiment 3, plasma etching conditions for the intermediate resist film 45, lower resist film 44 and conductor film 43 are the same as in the conventional plasma etching method using a three-layer resist film. The difference from the prior art is that also in the embodiment 3 the dust particle removing process, which has been explained in the Embodiments 1 and 2, is carried out in the plasma etching chambers 4a to 4c just before the stop of plasma discharge or during plasma etching. As a result, it becomes possible to greatly decrease the amount of dust particles deposited on the semiconductor wafer 7 during plasma etching for the intermediate resist film 45, lower resist film 44 and conductor film 43, and hence it becomes possible to carry out a plasma etching process using the following three-layer resist method. First, in the plasma etching chamber 4a, the intermediate resist film 45 is subjected to patterning according to plasma etching, using the upper resist film pattern 46 as a mask, to form an intermediate resist film pattern 45a, as shown in FIG. 19.

Figure 20:
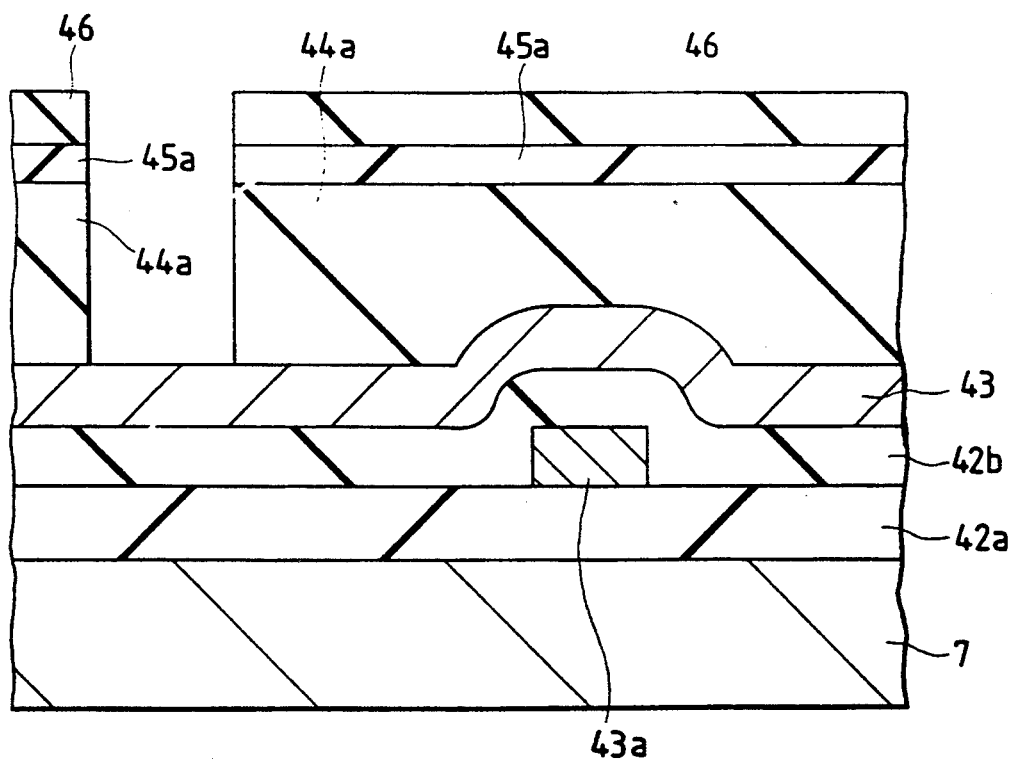
FIG. 20 is a sectional view of the principal portion of the substrate in plasma etching using the three-layer resist film which follows the process shown in FIG. 19.

After completion of the patterning of the intermediate resist film 45, the semiconductor wafer 7 is conveyed to the second plasma etching portion 4b through the vacuum conveyance chamber 3, that is, without going through a wet cleaning process or a resist pattern forming process and without breaking vacuum. In the second plasma etching chamber 4b, the lower resist film 44 is subjected to patterning by plasma etching, using the upper resist film pattern 46 and the intermediate resist film pattern 45a as masks, to form a lower resist film pattern 44a, as shown in FIG. 20.

Figure 21:
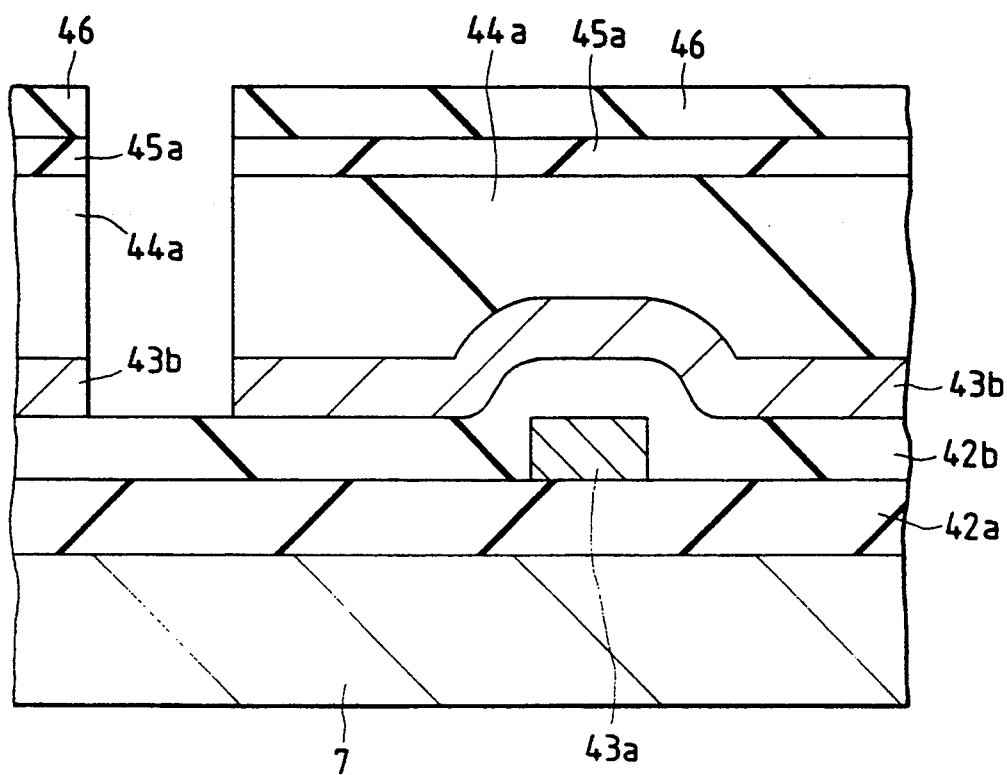
FIG. 21 is a sectional view of the principal portion of the substrate in plasma etching using the three-layer resist film which follows the process shown in FIG. 20.

Thereafter, the semiconductor wafer 7 is conveyed to the third plasma etching chamber 4c through the vacuum chamber 3, that is, without going through a wet cleaning process or a resist pattern forming process and without breaking vacuum. In the third plasma etching chamber 4c, the conductor film 43 is subjected to patterning by plasma etching, using the upper resist film pattern 46, intermediate resist film pattern 45a and lower resist film pattern 44a as masks, to form a second wiring pattern 43b, as shown in FIG. 21.

Thus, according to the Embodiment 3 it is possible to obtain the same effects as in the Embodiments 1 and 2 for three layer etching. Particularly, in a plasma etching process using a three-layer resist film, it is no longer necessary to perform wet cleaning at every plasma etching, so it is possible to attain a high processing efficiency. Since wet cleaning is not performed, it is possible to prevent the deterioration in stability of plasma and hence it is possible to improve the production yield and reliability of the semiconductor integrated circuit device.

Figure 22:
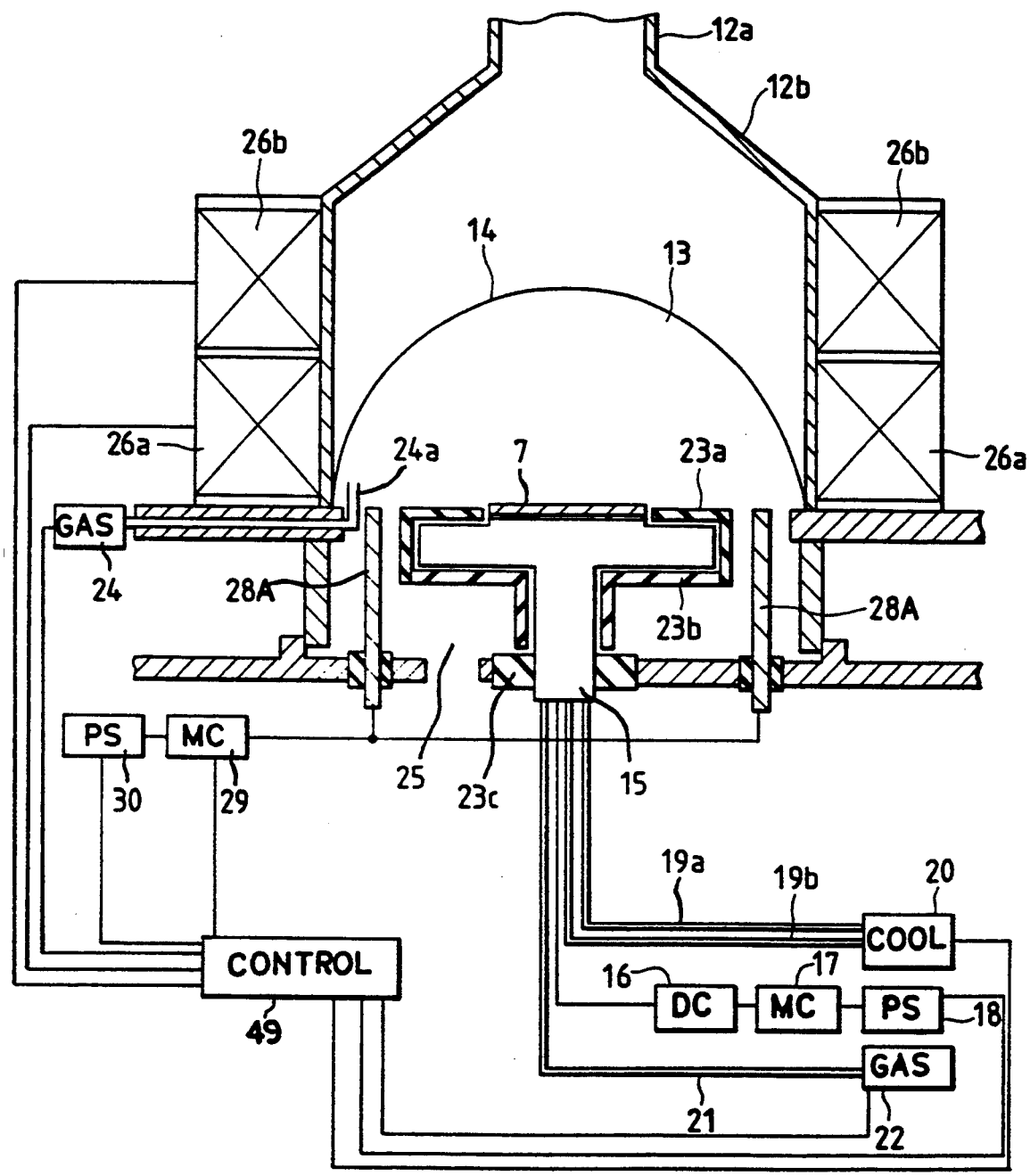
FIG. 22 is an explanatory view of plasma processing equipment according to a still further embodiment of the present invention.

Although the present invention has been described above on the basis of embodiments thereof, various other modifications may be made within the range not departing from the gist of the invention. Although the second plasma generating electrode used in the above embodiments 1 to 3 is ring-shaped in plan, as shown in FIG. 22, a plurality of rod-like second plasma generating electrodes 28A may be disposed along the outer periphery of the lower electrode 15. In this case, it is preferable that a micro-wave voltage of 2.45 GHz, for example, be applied to the second plasma generating electrodes 28A. And in this case it is possible to further improve the uniformity of sub-plasma.

Figure 23:
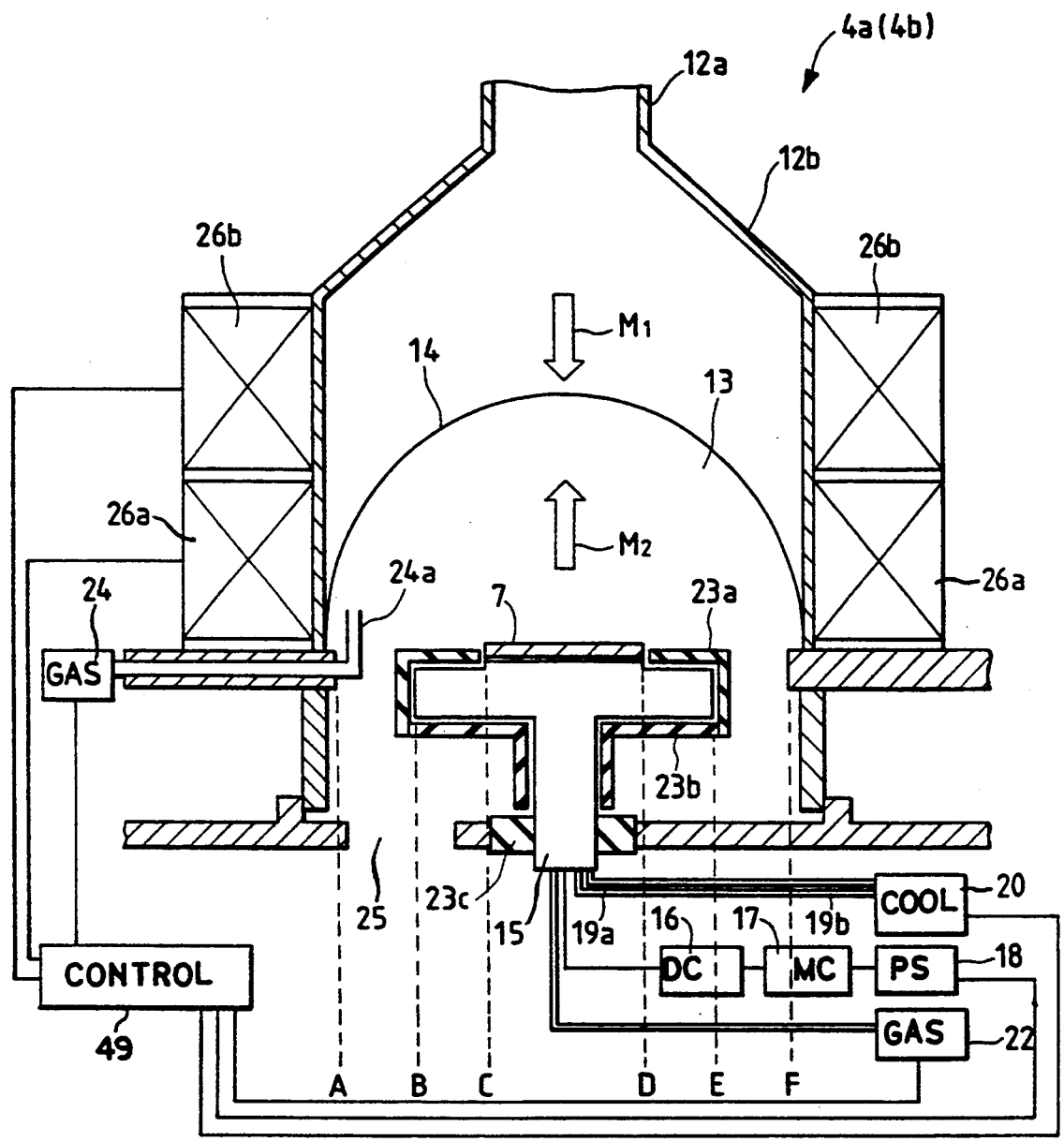
FIG. 23 is an explanatory view of a plasma processing according to a still further embodiment of the present invention.

Although in the above embodiments 1 to 3, the plasma density in the processing chamber is controlled to control the potential distribution by applying a high frequency voltage to the second plasma generating electrode, the plasma density in the processing chamber may be controlled to control the potential distribution by controlling the direction and intensity of the magnetic fields of electromagnets 26a and 26b. In this case, for example as shown in FIG. 23, the equipment is designed so that cusp magnetic fields $M_1$ and $M_2$ are formed by electromagnets 26a and 26b.

Figure 24:
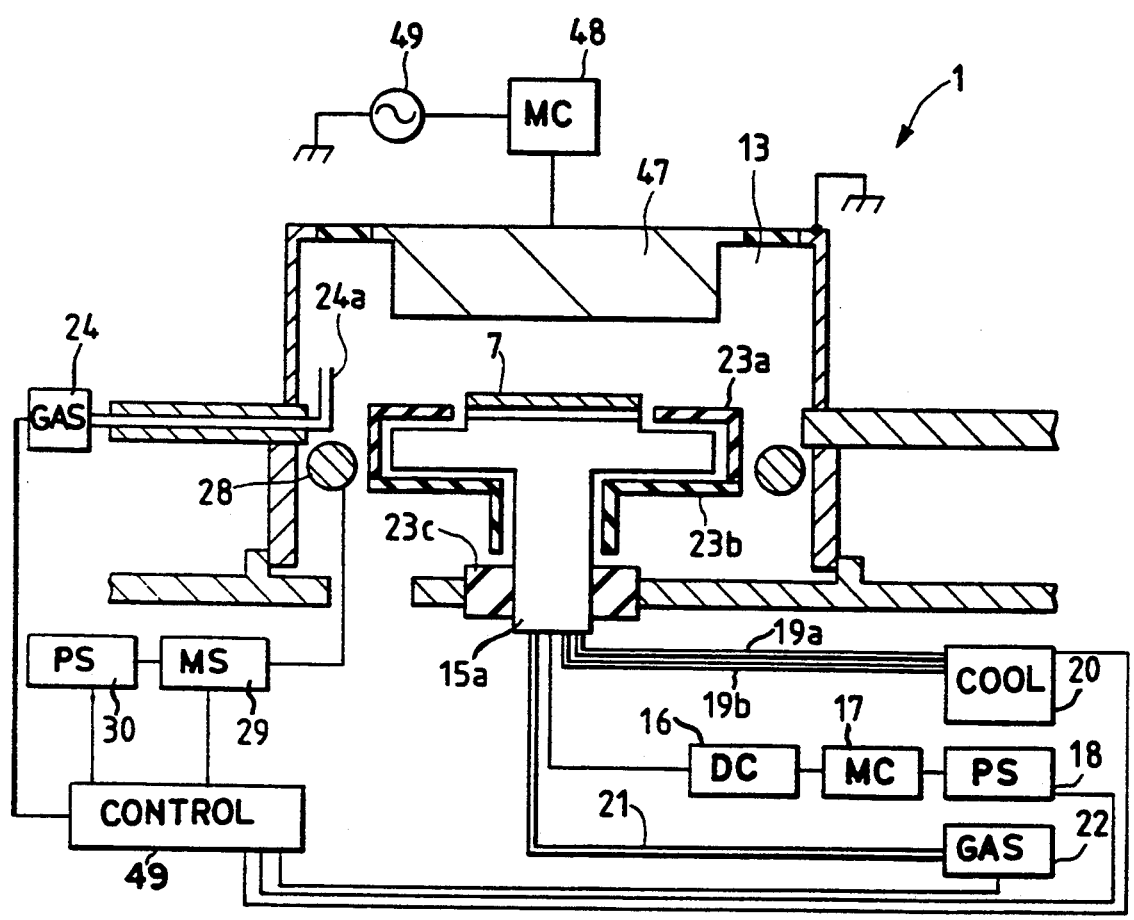
FIG. 24 is a view of plasma processing equipment according to a still further embodiment of the present invention.

Although the above embodiments 1 to 3 use microwave plasma etching, as shown in FIG. 24, a parallel flat plate type plasma etching equipment 1 may be used instead. In FIG. 24, an upper electrode 47 for main plasma generating is disposed above a lower electrode 15a for main plasma generating. The upper electrode 47 is connected electrically to a high frequency power supply 49 through a matching circuit (MC) 48. Within the processing chamber 13 there is disposed a sub-plasma generating electrode 28 which is ring-shaped in plan and which extends along the outer periphery of the lower electrode 15a.

Although in the above embodiments 1 to 3 a plurality of plasma etching chambers are connected together without breaking vacuum, at least one of the plasma etching portions may be connected to another different type of semiconductor manufacturing equipment without breaking vacuum.

Although in the above Embodiment 1 to 3 a microwave of 2.45 GHz is generated from the main plasma generating power supply, various modifications may be made. For example, a high frequency of 27 MHz may be generated.

Further, although in the above Embodiment 1 the conductor film which forms a gate electrode is constituted by doped polysilicon alone, various modifications may be made. For example, the conductor film may be constituted by a laminate of doped polysilicon film and a silicide film, or a laminate of doped polysilicon film and a high melting metal film such as tungsten or molybdenum film. However, in the case where the conductor film is a laminate of doped polysilicon film and a high melting metal film, it is necessary to divide the plasma etching chamber in view of the difference of etching gases. In this case, therefore, it is desirable to carry out etching using the three-chamber type plasma etching equipment described in the above Embodiment 3.

Although in the above Embodiment 1 a laminate of an insulating film and a conductor film is subjected to patterning by plasma etching, the laminate may be of a doped silicon film and a high melting metal film, or a double-layer resist film, or a laminate or a conductor film for wiring and a film of a barrier metal such as titanium.

Although in the above description the present invention is applied mainly to plasma etching, the present invention is applicable to other plasma systems, for example plasma CVD equipment.

The following is a brief description of the effects attained by the present invention as disclosed herein.

According to the foregoing, for example in plasma processing for the manufacture of a semiconductor integrated circuit device, a sub-potential distribution is formed just before the stop of plasma discharge and dust particles are thereby pushed out to the outer peripheral portion of the semiconductor wafer substrate to be processed and removed through an exhaust port or the like, whereby the amount of dust particles deposited on the wafer throughout the whole plasma processing period can be reduced to one-tenth or so as compared to the same process without using the sub-potential. Thus the defect density caused by dust particles can be lowered to a great extent, so it is possible to improve the production yield and reliability of the semiconductor integrated circuit device.

Moreover, since the amount of dust particles deposited in plasma processing can be decreased to a large extent, in the case where first and second plasma processes are to be carried out continuously, a shift to the second plasma etching process after the first plasma process can be done without going through such complicated processes as wet cleaning, resist removal and the formation of a resist pattern, and hence without breaking vacuum.

Consequently, the number of processes in continuous plasma processing can be decreased and it is possible to shorten the processing time, thus permitting a great improvement in the processing efficiency of such plasma processing. Therefore, it becomes possible to improve the manufacturing efficiency in the production of semiconductor integrated circuit devices and shorten the period for the development of such integrated circuit devices.

Further, since the shift to the second plasma process after the first plasma process can be done without contact of the semiconductor wafer with the air it becomes possible to prevent variations in the size of elements caused by oxidation, etc., prevent the depositing phenomenon of moistures, etc. on the semiconductor wafer and further prevent the phenomenon of plasma becoming unstable due to the presence of such moisture in the subsequent second plasma etching process. Consequently, it is possible to improve the production yield and reliability in the manufacture of semiconductor integrated circuit devices.

Additionally, in the case where first and second plasma processes are to be carried out continuously, since it is not necessary to provide a wet cleaning process after the first plasma process, it is no longer necessary for the plasma equipment to be provided with a wet cleaning mechanism, etc., thus permitting the reduction in size of the equipment.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. In a method for performing plasma processing of a substrate, with plasma being controlled by a potential distribution producing a first field adjacent to the substrate that tends to stagnate negatively charged dust particles in a processing chamber which contains the substrate, the improvement comprising:
    switching over the potential distribution in the processing chamber to a sub-potential distribution thereby producing a second field by applying high frequency alternating current electric power to a sub-electrode disposed adjacent to an outer periphery of the substrate; and
    pushing out the negatively charged dust particles stagnating near a main surface of the substrate toward the outer periphery of the substrate with the second field produced by the sub-potential.

2. A plasma processing method according to claim 1, wherein said step of switching to a sub-potential distribution is performed during plasma processing of the substrate or just before the discontinuation of plasma after the completion of the plasma processing.

3. A plasma processing method according to claim 1, wherein said plasma processing is plasma etching or plasma CVD.

4. A plasma processing method, including:
    forming a first plasma in a first processing chamber when the chamber contains a substrate to be processed;
    first plasma processing of the substrate with the first plasma with control by a first potential distribution that tends to stagnate negatively charged dust particles above the substrate in the first processing chamber;
    first switching over of the first potential distribution in the first processing chamber to a sub-potential distribution to push the negatively charged dust particles stagnating near a main surface of the substrate toward an outer periphery of the substrate;
    thereafter first conveying of the substrate after the first plasma processing to a second processing chamber in a non-oxidizing atmosphere including vacuum;
    second plasma processing of the substrate with a second plasma in the second processing chamber and in a second potential distribution that tends to stagnate negatively charged second dust particles above the substrate in the second processing chamber; and
    second switching over of the second potential distribution in the second processing chamber to a second sub-potential distribution to push negatively charged second dust particles stagnating near the main surface of the substrate toward the outer periphery of the substrate.

5. A method of producing a semiconductor integrated circuit wherein a substrate is plasma processed in a high vacuum chamber with a potential distribution forming a magnetic field adjacent the substrate to control the plasma processing, wherein the improvement is in the removal of negatively charged dust particles that stagnate adjacent the substrate during plasma processing due to the potential distribution and which negatively charged dust particles will contaminate the substrate upon discontinuance of plasma processing and the potential distribution, comprising the steps of:

while the negatively charged dust particles are stagnating adjacent the substrate, forming a sub-potential distribution that moves the negatively charged dust particles to the outer periphery of the substrate by applying a high frequency alternating current electric power to a sub-electrode disposed adjacent to the outer periphery.

6. A method of claim 5, including forming the first mentioned potential distribution with a first electrode structure and forming the sub-potential distribution with a second different electrode structure surrounding the first electrode structure.

7. A method of claim 6, wherein the first mentioned potential distribution has a potential amplitude that has the greatest attraction for the negatively charged dust particles in the center of the substrate and reduces attraction for the negatively charged dust particles towards the periphery of the substrate, and wherein the sub-potential distribution has a potential with the greatest attraction for the negatively charged dust particles at the periphery of the substrate and which attraction reduces towards the center of the substrate.

8. A method of claim 5, including exhausting gasses and the negatively charged dust particles in an exhaust gas area around the periphery of the substrate during the plasma processing.

9. A method of producing a semiconductor integrated circuit wherein a substrate is plasma processed in a high vacuum chamber with a potential distribution forming a field adjacent the substrate to control the plasma processing, wherein the improvement is in the removal of negatively charged dust particles that stagnate adjacent the substrate during plasma processing due to the potential distribution and which negatively charged dust particles will contaminate the substrate upon discontinuance of plasma processing and the potential distribution, comprising the steps of:

while the negatively charged dust particles are stagnating adjacent the substrate, forming a sub-potential distribution that moves the negatively charged dust particles to the outer periphery of the substrate; and throughout said plasma processing, monitoring the stagnating negatively charged dust particles and controlling said forming in accordance with said monitoring.

10. A method of producing a semiconductor integrated circuit wherein a substrate is plasma processed in a high vacuum chamber with a potential distribution forming a field adjacent the substrate to control the plasma processing, wherein the improvement is in the removal of negatively charged dust particles that stagnate adjacent the substrate during plasma processing due to the potential distribution and which negatively charged dust particles will contaminate the substrate upon discontinuance of plasma processing and the potential distribution, comprising the steps of:

while the dust particles are stagnating adjacent the substrate, forming a sub-potential distribution that moves the negatively charged dust particles to the outer periphery of the substrate; and supplying electric power sufficient to maintain the plasma adjacent the substrate and sufficient to conduct the plasma processing; and reducing the electrical power during said forming so that the reduced electric power is sufficient to maintain the plasma and insufficient to continue plasma processing.

11. The method of claim 5, wherein the first mentioned potential distribution has a potential amplitude that has the greatest attraction for the negatively charged dust particles in the center of the substrate and reduces attraction for the negatively charged dust particles towards the periphery of the substrate, and wherein the sub-potential distribution has a potential with the greatest attraction for the negatively charged dust particles at the periphery of the substrate and which attraction reduces towards the center of the substrate.

12. A method of producing a semiconductor integrated circuit wherein a substrate is plasma processed in a high vacuum chamber with a potential distribution forming a field adjacent the substrate to control the plasma processing, wherein the improvement is in the removal of negatively charged dust particles that stagnate adjacent the substrate during plasma processing due to the potential distribution and which negatively charged dust particles will contaminate the substrate upon discontinuance of plasma processing and the potential distribution, comprising the steps of:

while the negatively charged dust particles are stagnating adjacent the substrate, forming a sub-potential distribution that moves the negatively charged dust particles to the outer periphery of the substrate; and discontinuing plasma processing, transporting the substrate to a different plasma processing second chamber under continuous vacuum during the transporting and processing the substrate in the second chamber in the vacuum continuous with said transporting and said plasma processing.

13. The method of claim 12, wherein said plasma processing in the first chamber etches with respect to a first mask through one layer beneath the mask, and wherein said second plasma processing in the second chamber etches using the first mask and the remainder of the first layer to plasma process a second layer beneath the first layer.

14. The method of claim 7 including exhausting gasses and the dust particles in an exhaust gas area around the periphery of the substrate during the plasma processing.

15. The method of claim 6, including exhausting gasses and the negatively charged dust particles in an exhaust gas area around the periphery of the substrate during the plasma processing.

16. The method of claim 9, including supplying electric power sufficient to maintain the plasma adjacent the substrate and sufficient to conduct the plasma processing, and reducing the electrical power during said forming so that the reduced electric power is sufficient to maintain the plasma and insufficient to continue plasma processing.

17. The method of claim 15, wherein the first mentioned potential distribution has a potential amplitude that has the greatest attraction for the negatively charged dust particles in the center of the substrate and reduces attraction for the negatively charged dust particles towards the periphery of the substrate, and wherein the sub-potential distribution has a potential with the greatest attraction for the negatively charged dust particles at the periphery of the substrate and which attraction reduces towards the center of the substrate.

18. A plasma processing method for carrying out predetermined plasma processing to a major surface of a semiconductor wafer in a processing chamber, the predetermined plasma processing comprising:

forming a first electric potential distribution of processing space and plasma over and adjacent to the major surface of the semiconductor wafer so that the first electric potential distribution tends to stagnate negatively charged dust particles over the major surface of the wafer;

changing the first electric potential distribution of the processing space and plasma into a second electric potential distribution to evacuate the negatively charged particles over the major surface of the wafer to an outer periphery of the wafer by applying high frequency alternating current electric power to an electrode disposed adjacent to the outer periphery of the wafer; and thereby moving the negatively charged dust particles stagnating near the major surface of the wafer toward the outer periphery of the wafer with the second electric potential distribution.

19. A plasma processing method according to claim 18, wherein the step of changing the first electric potential distribution into the second electric potential distribution is performed during the predetermined plasma processing of the wafer or just before the discontinuation of plasma after the completion of the predetermined plasma processing.

20. A plasma processing method according to claim 18, wherein the predetermined plasma processing is plasma etching or plasma CVD.

21. A plasma processing method, comprising the steps of:

forming a first plasma in processing space of a first processing chamber adjacent to a major surface of a semiconductor wafer to be processed in the first processing chamber;

carrying out first plasma processing to the wafer with the first plasma with a first electric potential distribution of the processing space;

changing the first electric potential distribution in the first processing chamber to a second electric potential distribution of the processing space to evacuate negatively charged dust particles stagnating over the major surface of the wafer toward an outer periphery of the wafer;

transferring the wafer after the first plasma processing to a second processing chamber under a non-oxidizing atmosphere; and thereafter carrying out second plasma processing to the wafer in the second processing chamber.

22. A method of fabricating a semiconductor integrated circuit wherein a semiconductor wafer is plasma processed in a high vacuum chamber with a first electric potential distribution with a magnetic field adjacent to a major surface of the semiconductor wafer to control plasma processing, wherein the improvement is in the removal of negatively charged dust particles that stagnate over the major surface of the semiconductor wafer during the plasma processing due to the first electric potential distribution and which negatively charged dust particles will contaminate the wafer upon discontinuance of plasma processing and discontinuance of the first electric potential distribution, further comprising the steps of:

while the negatively charged dust particles are stagnating over the major surface of the semiconductor wafer, forming a second electric potential distribution and thereby moving the negatively charged dust particles to an outer periphery of the semiconductor wafer by applying a high frequency alternating current electric power to a peripheral electrode disposed adjacent to the outer periphery of the wafer.

23. A method of claim 22, wherein the first electric potential distribution is generated by a first electrode structure and the second electric potential distribution is generated by the first electrode structure and a second electrode structure surrounding the first electrode structure.

24. A method of claim 23, wherein the first electric potential distribution has a potential amplitude that has the greatest attraction for the negatively charged dust particles in the central area of the semiconductor wafer and reduces attraction for the negatively charged dust particles towards the periphery of the semiconductor wafer, and wherein the second electric distribution has a potential with the greatest attraction for the negatively charged dust particles at the periphery of the semiconductor wafer and which attraction reduces towards the central area of the semiconductor wafer.

25. A method of claim 22, further comprising exhausting gasses and negatively charged dust particles in an exhaust gas around the periphery of the wafer during the plasma processing.

26. A method of fabricating a semiconductor integrated circuit wherein a semiconductor wafer is plasma processed in a high vacuum chamber with a first electric potential distribution adjacent to a major surface of the semiconductor wafer to control the plasma processing, wherein the improvement is in the removal of negatively charged dust particles that stagnate adjacent the wafer during the plasma processing due to the first electric potential distribution and which negatively charged dust particles will contaminate the semiconductor wafer upon discontinuance of plasma processing and discontinuance of the first electric potential distribution, further comprising the steps of:

while the negatively charged dust particles are stagnating adjacent the wafer, forming a second potential distribution that moves the negatively charged dust particles to the outer periphery of the semiconductor wafer; and throughout the plasma processing, monitoring the stagnating negatively charged dust particles.

27. A method of fabricating a semiconductor integrated circuit by plasma processing a semiconductor wafer in a high vacuum chamber with a first electric potential distribution adjacent to a major surface of the semiconductor wafer to control the plasma processing, wherein the improvement is in the removal of negatively charged dust particles that stagnate adjacent the wafer during the plasma processing due to the first electric potential distribution and which negatively charged dust particles will contaminate the wafer upon discontinuance of plasma processing and discontinuance of the first electric potential distribution, the improvement comprising the steps of:

while the negatively charged dust particles are stagnating over the semiconductor wafer, forming a second potential distribution and thereby moving the negatively charged dust particles to the outer periphery of the semiconductor wafer;

supplying electric power sufficient to maintain the plasma adjacent to the wafer and sufficient to conduct the plasma processing at least prior to said moving; and reducing the electrical power during said moving so that the reduced electric power is sufficient to maintain the plasma and insufficient to continue plasma processing.

28. The method according to claim 22, wherein the first electric potential distribution has a potential amplitude that has greatest attraction for the negatively charged dust particles in a center of the semiconductor wafer and reduces attraction for the negatively charged dust particles towards a periphery of the semiconductor wafer, and wherein the second electric potential distribution has a potential with greatest attraction for the negatively charged dust particles at the periphery of the semiconductor wafer and which attraction reduces towards the center of the semiconductor wafer.

29. A method of fabricating a semiconductor integrated circuit wherein a semiconductor wafer is plasma processed under a high vacuum condition in a first plasma processing chamber with a first electric potential distribution adjacent to a major surface of the semiconductor wafer to control plasma processing, wherein the improvement is in the removal of negatively charged dust particles that stagnate over the semiconductor wafer during the plasma processing due to the first electric potential distribution and which negatively charged dust particles will contaminate the semiconductor wafer upon discontinuance of the plasma processing and discontinuance of the first electric potential distribution, the improvement comprising the steps of:

(a) while the negatively charged dust particles are stagnating over the major surface of the semiconductor wafer in the first plasma processing chamber, forming a second electric potential distribution and thereby moving the negatively charged dust particles to the outer periphery of the semiconductor wafer;

(b) discontinuing the plasma processing;

(c) after step (b), transporting the semiconductor wafer to a second plasma processing chamber under a vacuum condition during the transporting; and (d) carrying out second plasma processing to the semiconductor wafer in the second chamber in a vacuum condition without exposing the semiconductor wafer to an outer gas atmosphere throughout and between the steps of (a) to (d).

30. The method of claim 27 wherein said plasma processing in the first chamber etches with respect to a first mask through one layer beneath the mask, and wherein said second plasma processing in the second chamber etches using the first mask and the remainder of the first layer to plasma process a second layer beneath the first layer.

31. The method of claim 24, further comprising:
exhausting gasses and dust particles in an exhaust gas area around the periphery of the semiconductor wafer during the plasma processing in the first plasma processing chamber.

32. The method of claim 23, further comprising:
exhausting gasses and dust particles in an exhaust gas area around the periphery of the semiconductor wafer during the plasma processing in the first plasma processing chamber.

* * * * *